(12) United States Patent
Henningson et al.

(10) Patent No.: US 6,359,442 B1
(45) Date of Patent: Mar. 19, 2002

(54) MICROPROCESSOR-BASED HAND-HELD BATTERY TESTER SYSTEM

(75) Inventors: Dale B. Henningson, Manti; Bryan R. Lundbeck, Moroni, both of UT (US)

(73) Assignee: Auto Meter Products, Inc., Sycamore, IL (US)

( * ) Notice: Subject to any disclaimer, the term of this patent is extended or adjusted under 35 U.S.C. 154(b) by 69 days.

(21) Appl. No.: 09/590,350

(22) Filed: Jun. 8, 2000

(51) Int. Cl.[7] ............................................. G01N 27/416
(52) U.S. Cl. ...................................... 324/426; 324/429
(58) Field of Search ................................ 324/426, 429, 324/430, 433, 383, 384, 380; 429/90, 92

(56) References Cited

U.S. PATENT DOCUMENTS

| | | | |
|---|---|---|---|
| 5,254,952 A | * 10/1993 | Salley et al. | 324/426 |
| 5,572,136 A | 11/1996 | Champlin | 324/426 |
| 5,635,841 A | * 6/1997 | Taylor | 324/380 |
| 5,757,192 A | 5/1998 | McShane et al. | 324/427 |
| 5,821,756 A | 10/1998 | McShane et al. | 324/430 |
| 5,831,435 A | 11/1998 | Troy | 324/426 |
| 5,914,605 A | 6/1999 | Bertness | 324/430 |
| 5,945,829 A | 8/1999 | Bertness | 324/430 |
| 6,037,778 A | 3/2000 | Makhija | 324/433 |
| 6,051,976 A | 4/2000 | Bertness | 324/426 |
| 6,091,245 A | 7/2000 | Bertness | 324/426 |

FOREIGN PATENT DOCUMENTS

WO      WO 99/56121 A1    11/1999    ........ G01N/27/46

OTHER PUBLICATIONS

Product Literature for Micro 200/205 of Midtronics, Inc. USA, Dec. 30, 1998, Rev. 2.0.
Product Literature for Monitron MCT–148 of Midtronics, Inc. USA, Dec. 30, 1998, Rev. 2.0.
Product Literature for Midtron 3200 of Midtronics, Inc. USA, Dec. 30, 1998, Rev. 2.0.
Product Literature for Celltron Plus of Midtronics, Inc. USA, Dec. 30, 1998, Rev. 2.0.
Product Literature for Micro Celltron of Midtronics, Inc. USA, Dec. 30, 1998, Rev. 2.0.

* cited by examiner

*Primary Examiner*—Peter S. Wong
*Assistant Examiner*—Lawrence Luk
(74) *Attorney, Agent, or Firm*—Jenkens & Gilchrist

(57) ABSTRACT

A system for determining the operating characteristics of an energy source. The system comprises a controller for generating and shaping a time-varying voltage signal for application to the energy source; a converter for receiving from the energy source a time-varying return voltage signal and for converting the tire-varying return voltage signal into a digital signal. The amplitude of the time-varying return signal contains information representative of the operating characteristics of the energy source. The time-varying return voltage signal is produced in response to the time-varying voltage signal. The controller is responsive to the digital signal and determines the operating characteristics of the energy source. The controller generates display signals, and the display signals are representative of the operating characteristics of the energy source. The system also includes a display for displaying the display signals.

32 Claims, 19 Drawing Sheets

MICROPROCESSOR-BASED HAND-HELD BATTERY TESTER SYSTEM

FIELD OF INVENTION

This invention relates generally to systems for testing the conditions of lead-acid batteries, as well as starters and alternators used in conjunction with the batteries. In particular, the present invention relates to such testers that are microprocessor-controlled hand-held units.

BACKGROUND

The following symbols will have the following meanings in the description of the preferred battery testing system embodying this invention:

V(bat) The terminal voltage of the battery.

V(d) Voltage drop across the battery due to an internal resistance and a load current.

CA Cranking Amps, the current that the battery can supply for 30 seconds at full charge and at 70° F. and not drop the battery voltage below 1.2 volts per cell.

Cold Cranking Amps (CCA) are defined by the Battery Council International (BCI) as "the number of amperes a battery at 0° F. (−17.8° C.) can deliver for 30 seconds and maintain, at least, a voltage of 1.2 volts per cell (lead-acid)". For example, a 12-volt lead-acid battery having 6 cells with 1.2 volts/cell must not drop below 7.2 volts. A fully charged battery has an open circuit voltage of 12.6 volts. The voltage drop from 12.6 volts to 7.2 volts is 5.4 volts. Therefore, at 0° F., the CCA of the battery is the current that the battery can supply and drop the voltage not more that 5.4 volts at the end of 30 seconds. For a 6-volt lead-acid battery, the maximum drop is 2.7 volts and for a 24-volt lead-acid battery, the maximum drop is 10.8 volts.

SUMMARY OF THE INVENTION

It is an object of the invention to provide an improved hand-held testing unit that uses a microprocessor to perform test measurements on lead-acid batteries and the systems in which they are used, including the starters and alternators in such systems.

A specific object of one preferred embodiment of the invention is to provide such a hand-held testing system which is light and portable and yet is capable of subjecting lead-acid batteries to a load test drawing current as high as 200 amperes from the battery.

Still another object of the invention is to provide a hand-held battery testing system that is capable of subjecting a lead-acid battery to a load test without significantly reducing the state-of-charge of the battery.

Another object of the invention is to provide such a hand-held testing system that permits the user to load test a lead-acid battery, check the condition of the alternator, and perform a starter draw test with ease, using a single test unit.

Still another object of the invention is to provide such a testing unit that permits the test results to be printed and/or downloaded to a computer.

Yet another object of the invention is to provide a hand-held testing system that can also be used as a voltmeter.

In this connection, a related object of the invention is to provide such a system that automatically checks whether the tester is properly connected to the battery before the battery is subjected to the load test.

In accordance with the present invention, the foregoing objectives are realized by providing a system that determines the condition of a lead-acid battery by measuring the beginning voltage across the terminals of the battery in the absence of a load; connecting the battery to a first load, measuring the AC ripple in the output current drawn from the battery by the first load, and computing an estimated CCA of the battery using the beginning voltage and the AC ripple; connecting the battery to a second load that draws more current from the battery than the first load and measuring the loaded voltage of the battery, and evaluating the condition of the battery at least in part on the basis of the beginning voltage and the estimated CCA.

BRIEF DESCRIPTION OF THE DRAWINGS

FIG. 8b is a flow chart of a "measure CCA" subroutine accessed by the subroutine of FIG. 8a;

DESCRIPTION OF THE PREFERRED EMBODIMENT

An illustrative embodiment of a hand-held tester is described below as it might be implemented to provide for improved methods of determining the operating conditions of lead-acid batteries, and starters and alternators used with such batteries.

Figure 1:
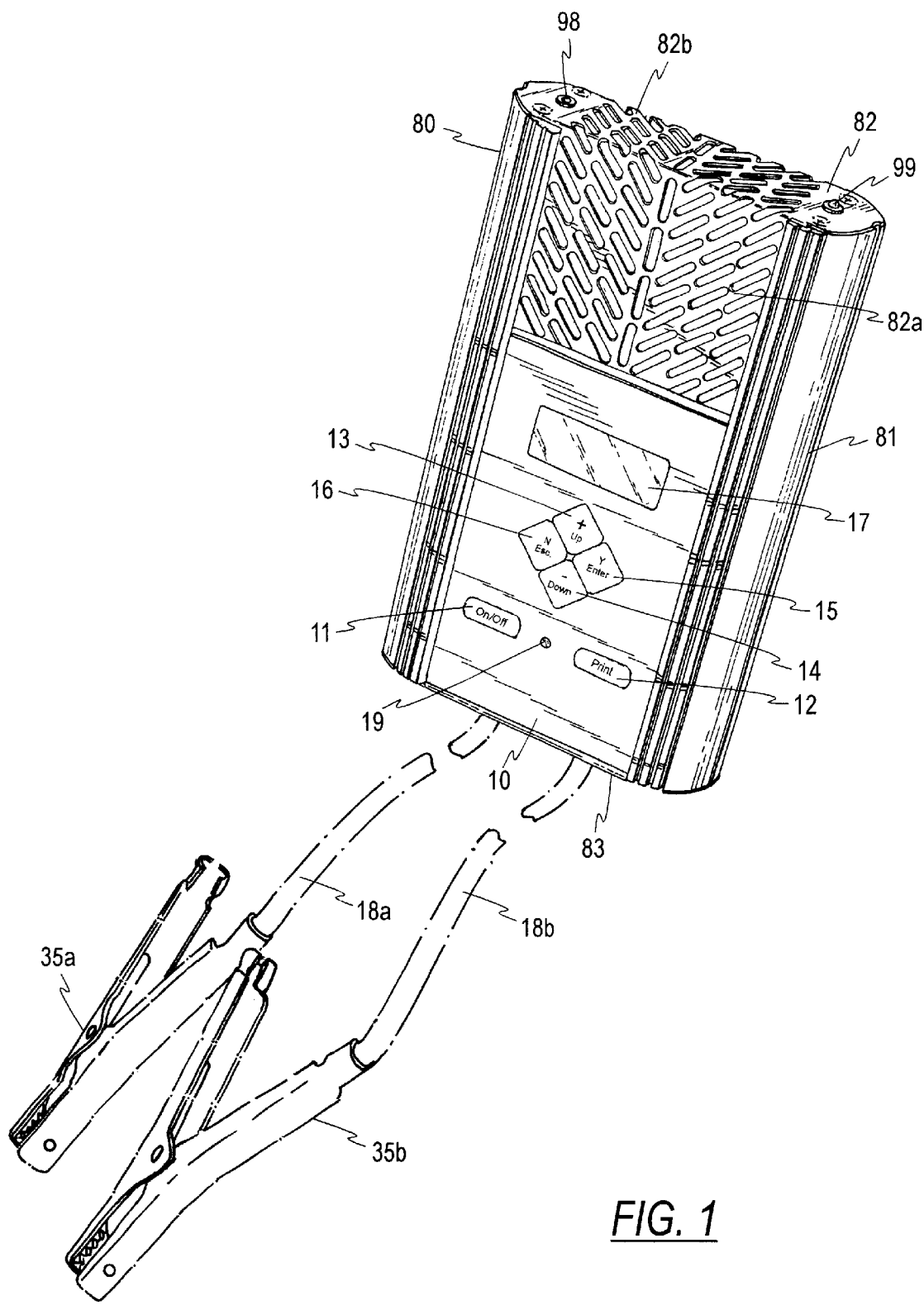
FIG. 1 is a perspective view of a hand-held battery and charging system analyzer embodying the invention.

FIG. 1 is a perspective view of the front and bottom of a hand-held tester embodying the invention. The front panel 10 includes an on/off switch 11, a print switch 12 and four manual keys 13, 14, 15 and 16 that are used in conjunction with a liquid crystal display (LCD) 17. The keys 13–16 provide input signals to a microprocessor that controls the operation of the tester, including the messages or data displayed on the LCD 17. A pair of battery cables 18a and 18b extend from one end of the hand-held unit for connection to the posts of a lead-acid battery B to be tested. A reverse-connection indicator 19 on the front panel 10 is illuminated when the cables are connected to the wrong posts of the battery. The reverse connection indicator 19 is simply an LED having its anode connected to the small wire of the negative battery cable and its cathode connected through a current-limiting resistor to the positive battery cable.

Figure 2:
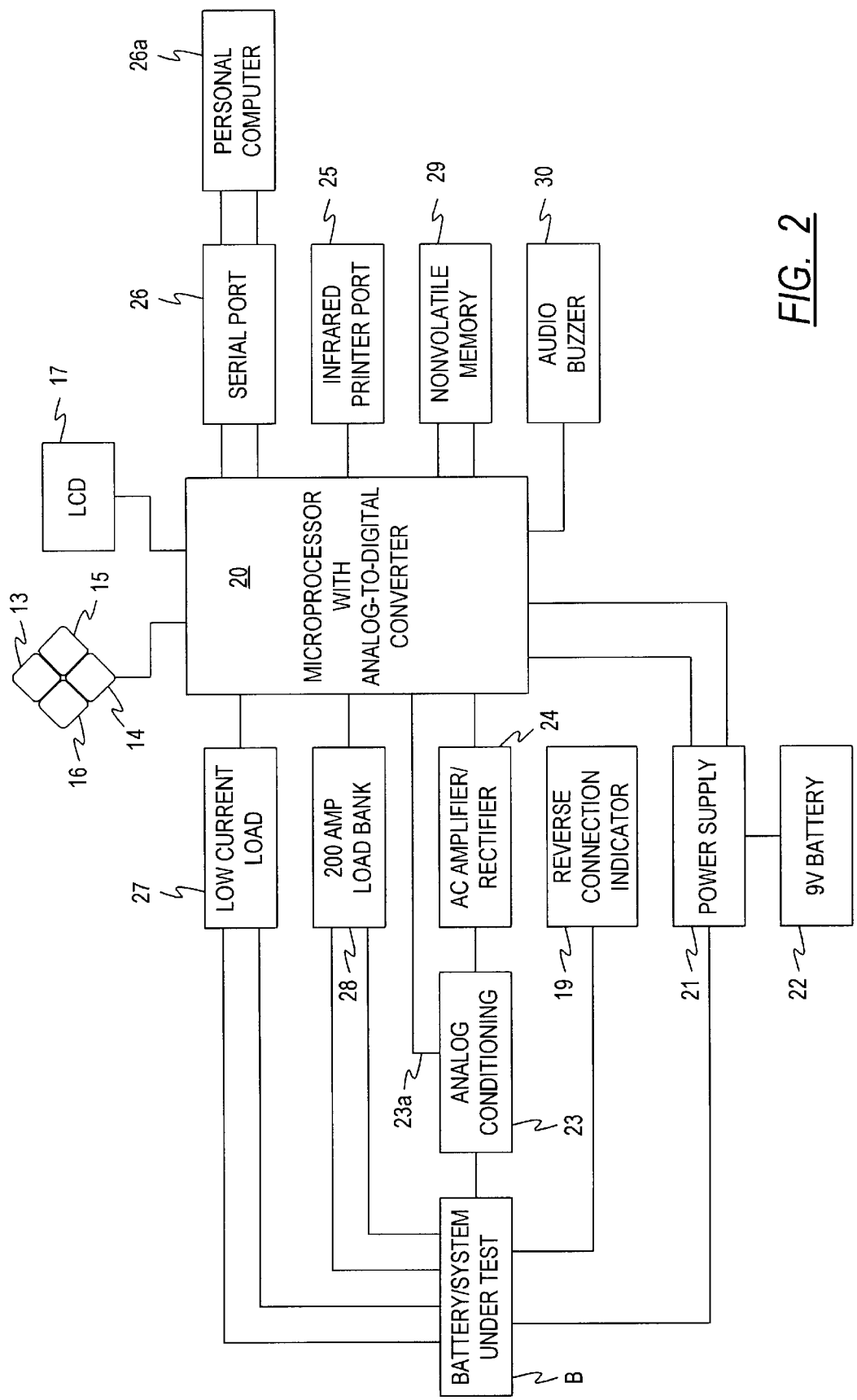
FIG. 2 is a block diagram of the testing system in the analyzer shown in FIG. 1.

The overall tester system is illustrated by the block diagram in FIG. 2. The system is controlled by a microprocessor 20 that receives power from a power supply 21 which in turn is powered by the lead-acid battery B under test. A 9-volt battery 22 provides an alternative power source when the tester is not connected to a battery B to be tested. The microprocessor 20 receives input signals from the four manually operated keys 13–16, an analog conditioning circuit 23, and an AC amplifier/rectifier circuit 24, as will be described in more detail below. The microprocessor 20 provides output signals to the LCD 17 for communicating with the user, to an infrared printer port 25 for printing results for the user, to a serial port 26 for communicating with an off-board computer such as a PC 26a, to a pair of load circuits 27 and 28 that can be connected to the battery B for load testing, and to an audio buzzer 30 for providing audible alarms or signals to the user. The microprocessor 20 is also connected to a nonvolatile memory 29 for storing and retrieving data that is to be preserved in the event of a loss of power to the system.

Figure 3:
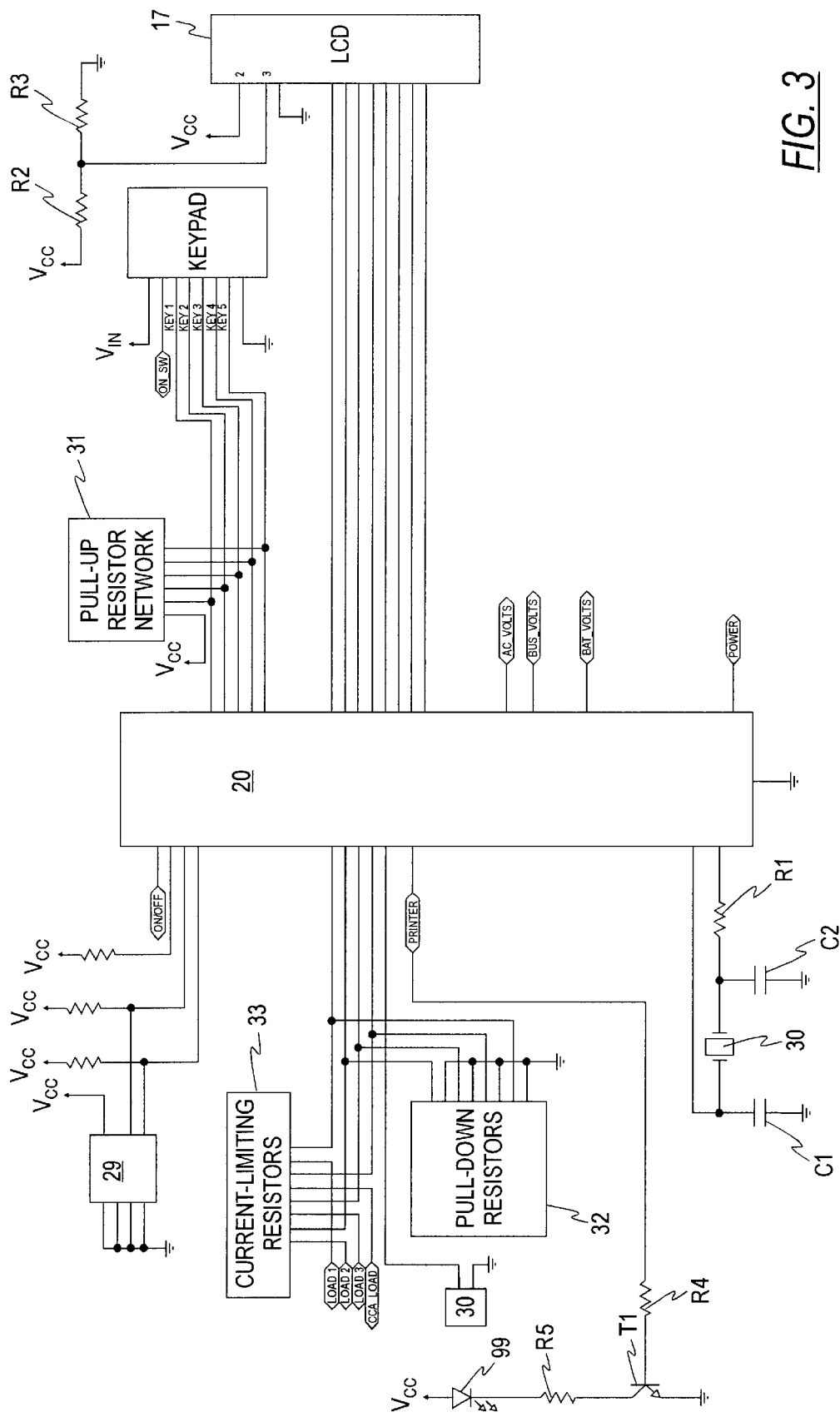
FIG. 3 is a circuit diagram of a portion of the system illustrated in FIG. 2, including the microprocessor and its display, keypad and nonvolatile memory.

FIG. 3 is a more detailed diagram of the system illustrated in FIG. 2. The microprocessor 20, which has a built-in analog-to-digital converter, receives an ON/OFF input signal from the power supply circuit 21 shown in more detail in FIG. 4, an ON_SW signal from the on/off key 11

Figure 6:
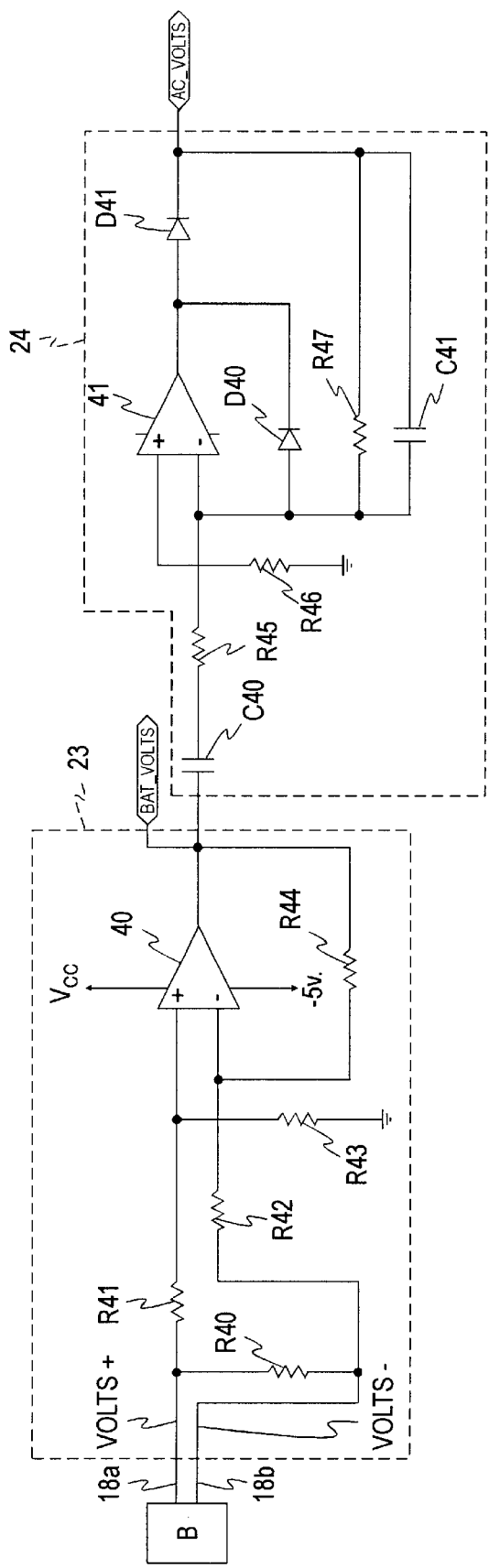
FIG. 6 is a circuit diagram of an analog conditioning and AC amplifier/rectifier circuit used in the system illustrated in FIG. 2.

KEY1, KEY2, KEY3, KEY4 and KEY5 signals from the four manually operated keys 13–16 and the print key 12 via a pull-up resistor network 31, a BAT_VOLTS signal from the analog conditioning circuit 23 shown in more detail in FIG. 6, an AC_VOLTS signal from the AC amplifier/rectifier circuit 24 shown in more detail in FIG. 6, oscillator signals from an oscillator comprising a crystal 30, a pair of capacitors C1 and C2, and a current-limiting resistor R1, and data signals from the non-volatile memory 29.

Figure 4:
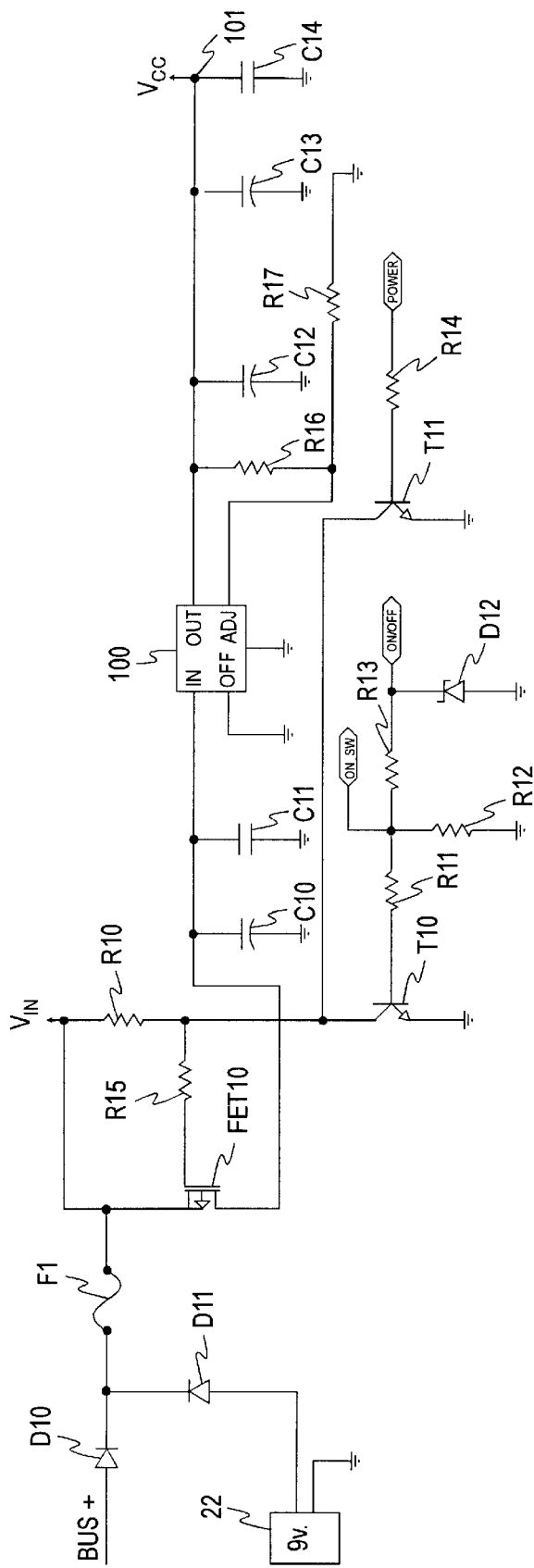
FIG. 4 is a circuit diagram of a power supply circuit used in the system illustrated in FIG. 2.

Output signals produced by the microprocessor 20 are:

display-generating signals to the 4×16 LCD 17 which also receives Vcc at terminal 2 and a reduced Vcc at terminal 3 to set the LCD contrast (the reduction is achieved by a voltage divider formed by a pair of resistors R2 and R3 connected between Vcc and ground, with terminal 3 of the LCD receiving the voltage that exists between the two resistors), a POWER signal for the power supply circuit 21 shown in FIG. 4, a PRINTER signal for the infrared transducer used to communicate with printers, switching signals LOAD1, LOAD2, LOAD3 and CCA_LOAD supplied via pull-down resistors 32 and current limiting resistors 33 to control FETs that connect and disconnect various loads to the battery being tested, and data signals to be stored in the non-volatile memory.

Coupling to a printer is effected by an infrared coupling diode 99 mounted in the upper end of the tester (see FIGS. 1 and 3). The PRINTER signal from the microprocessor 20 is supplied via resistor R4 to the base of a transistor T1. When the transistor T1 is turned on, current flows from a Vcc source through the diode 99, a resistor R5 and the transistor T1 to ground. The power supply 21 is illustrated in more detail in FIG. 4. The BUS+ input to the power supply circuit is connected to the large wire of the positive battery cable, and ground is connected to the large wire of the negative battery cable. The supply current from the BUS+ input passes through a blocking diode D10 and a resettable fuse F1 that trips under high currents, then resets after allowing for a period to reset. The diode D10 prevents damage to the tester if the leads connected to the battery are reverse-connected. When the battery cables are not connected to a battery, the power supply circuit is powered by the 9-volt battery 22 through a blocking diode D11.

The power supply circuit is turned on by the ON_SW signal from the on/off switch 11, and then is kept on by the POWER output signal from the microprocessor 20. These signals turn on either switching transistor T10 or switching transistor T11 to draw current through a pull-up resistor R10. Specifically, the signal ON_SW is applied to the base of the switching transistor T10 through a current-limiting resistor R11 and is also supplied to a pull-down resistor R12 connected to ground. An ON/OFF signal to the microprocessor 20 is also supplied from the keypad through a second current-limiting resistor R13, and a voltage-limiting zener diode D12 which is connected from the ON/OFF terminal to ground. The POWER signal from the microprocessor 20 is supplied to the base of the switching transistor T11 through a current-limiting resistor R14.

A low voltage at the collector of either transistor T10 or T11 turns on a field effect transistor ("FET") 10, which then supplies current from the BUS+ input to the input terminal of a voltage-regulating IC 100 to switch on the power. The gate of the FET 10 is protected by a resistor R15, and a pair of filter capacitors C10 and C11 are connected in parallel from the input of IC 100 to ground. The output of the IC 100 is connected to a terminal Vcc which is connected to a conventional voltage converter to furnish −5 volt power throughout the unit. Three filter capacitors C12, C13 and C14 are connected in parallel from the terminal Vcc to ground. A voltage divider is formed by a pair of resistors R16 and R17 to supply a desired voltage level to the "adjust" input of the IC 100. The voltage level Vin that exists between the resistor R10 and the fuse F1 is supplied to the keypad, as shown in FIG. 4.

The power supply circuit can be turned off by the microprocessor 20 sending a low signal to the POWER output after the on/off switch 11 has been pressed or after the unit has been on for two minutes with no activity. When the on/off switch 11 is pressed while the power supply is on, the resulting change in the ON_SW signal is sensed by the microprocessor 20, which responds by producing a low POWER signal. This turns off the transistor T11, which turns off the power supply.

Figures 5A, 5B:
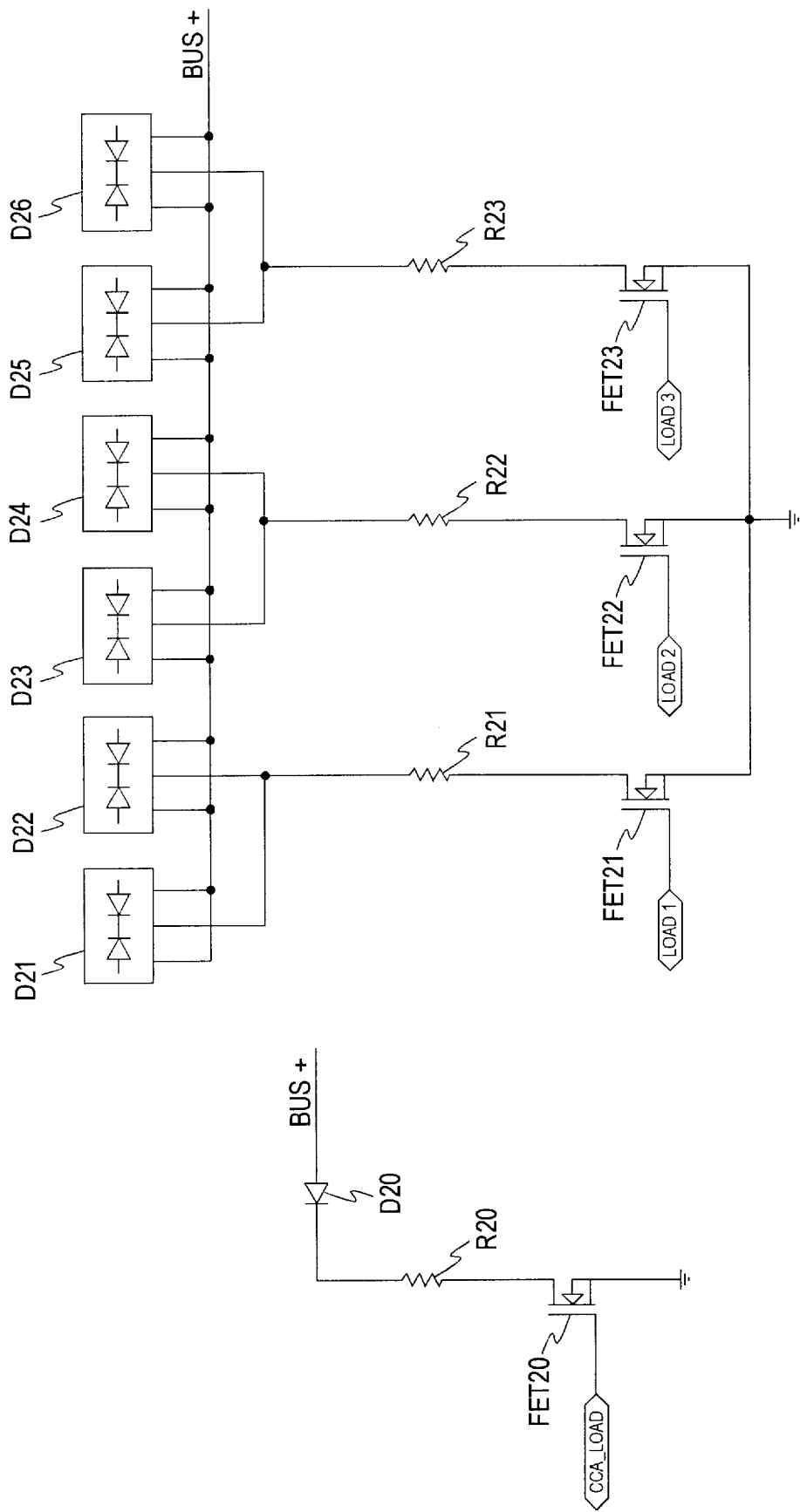
FIGS. 5a and 5b are circuit diagrams of two load circuits used in the system illustrated in FIG. 2.

The two load circuits 27 and 28 are shown in more detail in FIGS. 5a and 5b, respectively. The low-current load circuit of FIG. 5a is connected to the battery to receive the BUS+ input by a CCA_LOAD signal from the microprocessor 20. The CCA_LOAD signal turns on a switching FET 20 so that current can flow from the BUS+ input through a reverse-blocking diode D20 and a current-setting resistor R20 to ground. As will be described in more detail below, the low-current load is connected to the battery when it is desired to determine an estimated CCA for the battery under test.

The high-current (e.g., 200-amp) load bank circuit of FIG. 5b comprises three parallel resistors R21, R22 and R23, each of which can be connected to the battery by its own separate signal LOAD1, LOAD2 or LOAD3 which turns on a corresponding switching FET 21, 22 or 23 so that current can flow from the battery (BUS+) through reverse blocking diodes D21–D26 and one or more of the resistors R21–R23 to ground. As will be described in more detail below, the 200-amp load is connected to the battery when it is desired to load test the battery to evaluate its condition.

The analog conditioning circuit 23 and the AC amplifier/ rectifier circuit 24 are shown in FIG. 6. The analog conditioning circuit 23 is connected to the terminals or posts of the battery B for measuring the voltage across those posts. The connections to the battery terminals are made with the clamps on the ends of the battery cables 18a, 18b extending from the lower end of the test unit. These clamps are preferably kelvin style battery clamps 35a and 35b whose twin positive and twin negative leads (and contacts) are insulated from each other. The VOLTS+ input to the circuit 23 is connected to the small wire of the positive battery cable, while the VOLTS− input is connected to the small wire of the negative battery cable. A pull-down resistor R40 is connected between the two cables 18a and 18b.

In FIG. 6, the VOLTS+ and VOLTS− inputs are connected to the + and − inputs of an operational amplifier 40 via gain-setting resistors R41–R44 in a difference amplifier configuration. The output of the operational amplifier 40 furnishes the analog BAT_VOLTS signal that represents the output voltage of the battery being tested. This signal is one of the inputs to the microprocessor 20 and its internal analog-to digital (A/D) converter.

The output of the operational amplifier 40 is also supplied through an AC coupling capacitor C40 to the AC amplifier/ rectifier circuit 24 to produce a DC output representing the magnitude of any AC ripple in the battery voltage. Specifically, the capacitor C40 is connected through a gainsetting resistor R45 to the negative input of an operational amplifier 41 whose positive input is connected to a pulldown resistor R46. The output of the amplifier 41 is connected to a pair of rectifying diodes D40 and D41, and an integrating capacitor C41 is connected in parallel with the two diodes. The resulting DC output of the circuit 24 furnishes the AC_VOLTS signal that represents the magnitude of the AC ripple and is one of the inputs to the microprocessor 20.

Figure 7:
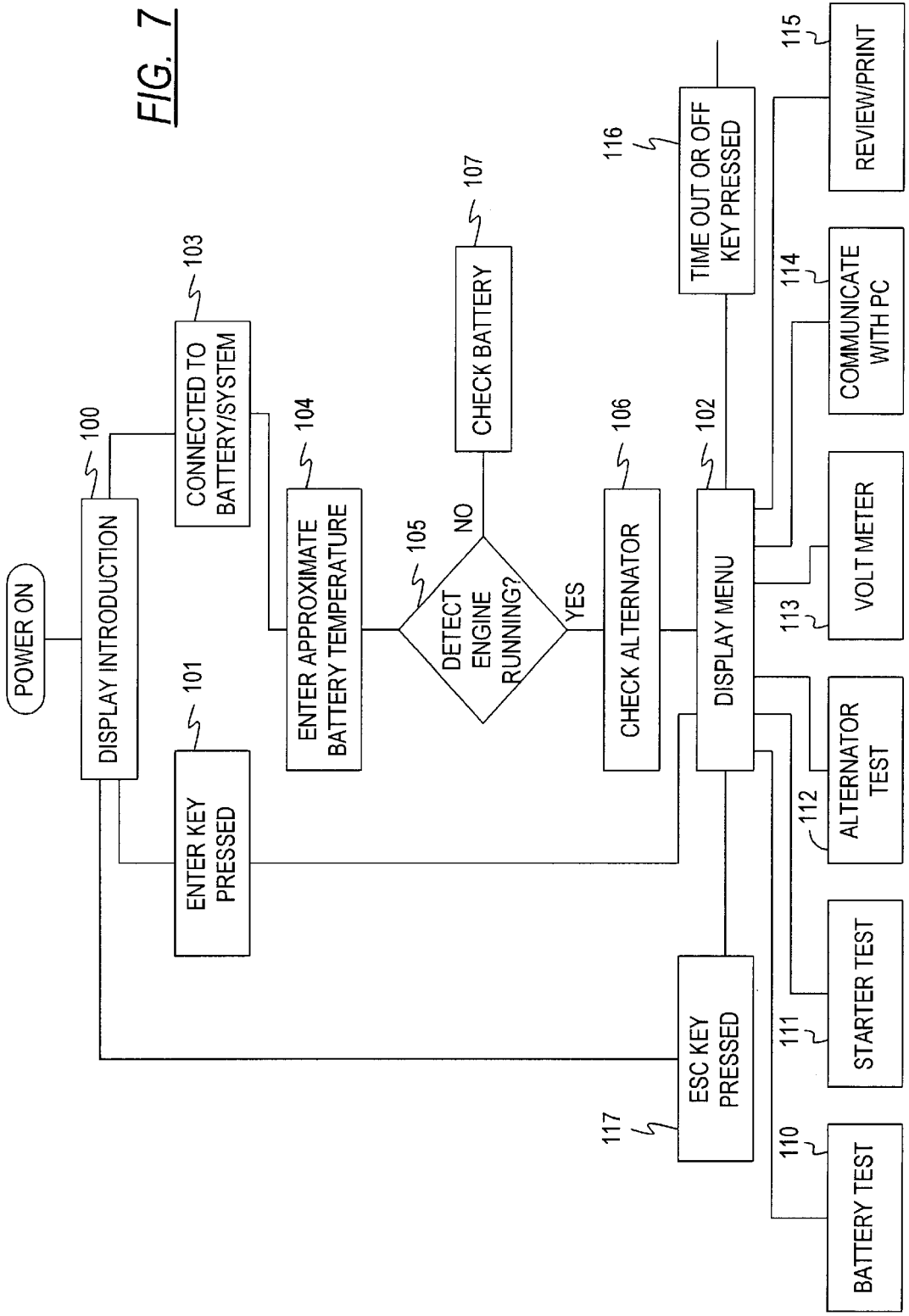
FIG. 7 is a flow chart of the main software program executed by the microprocessor in the battery tester system of FIG. 2 to initiate operation of the system.

Turning now to the main program that is shown in FIG. 7 and executed by the microprocessor 20, this program is entered when the microprocessor detects that the power supply is turned on. The first step 100 of the main program displays an introductory message on the LCD 17, informing the user that the unit is "ready to connect" to a battery to be tested. At this point the user may press the enter key 15, detected at step 101, to cause the program to jump ahead to step 102 where a menu is displayed to provide the user with multiple options. The options are battery test, starter test, alternator test, review/print, volt meter and download/setup.

Whenever the menu is displayed at step 102, the system waits for the user to select one of the options by pressing the up or down key 13 or 14 to scroll to the desired option and then pressing the enter key 15. Each selection calls one of six subroutines at one of the six steps 110–115. If no option is selected within a time-out interval measured by the microprocessor 20, or if the on/off key 11 is pressed, the subroutine is exited at step 116. The subroutine may also be exited by pressing the escape key 16 at any time during display of the introduction at step 100 or the options menu at step 102. Pressing of the escape key 16 is detected at step 117.

If the user does not press the enter key 15 when the introductory message is displayed at step 100, the system waits for the user to connect the tester to a battery, which is detected at step 103. The program then advances to step 104 where a message is displayed to prompt the user to "enter approximate battery temperature" in degrees F. The user enters the temperature by using up/down keys 13, 14 to scroll through the displayed battery temperatures and select the appropriate temperatures, and then pressing the enter key 15 to enter the selected temperature. The selected temperature is stored in the internal RAM of the microprocessor 20.

After the selected battery temperature has been entered, the system advances to step 105 which detects whether the engine-driven alternator connected to the battery B is running, by measuring the AC ripple represented by the AC_VOLTS signal from the amplifier/rectifier circuit 24. An AC ripple greater than 4 mV means that the engine is running. An affirmative response at step 105 advances the system to step 106 which calls a "check alternator" subroutine. A negative response at step 105, i.e., detection of an AC ripple that is less than 4 mV, causes the system to proceed to step 107 to call a "check battery" subroutine. When either subroutine is completed, the options menu is displayed at step 102.

Figure 8B:
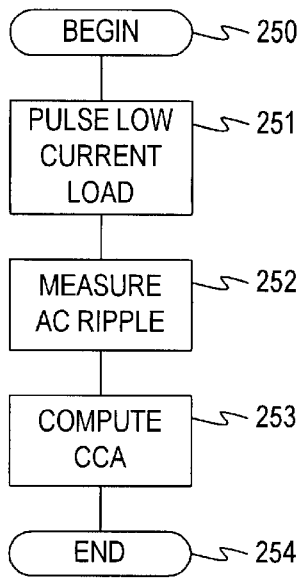
Figure 8A:
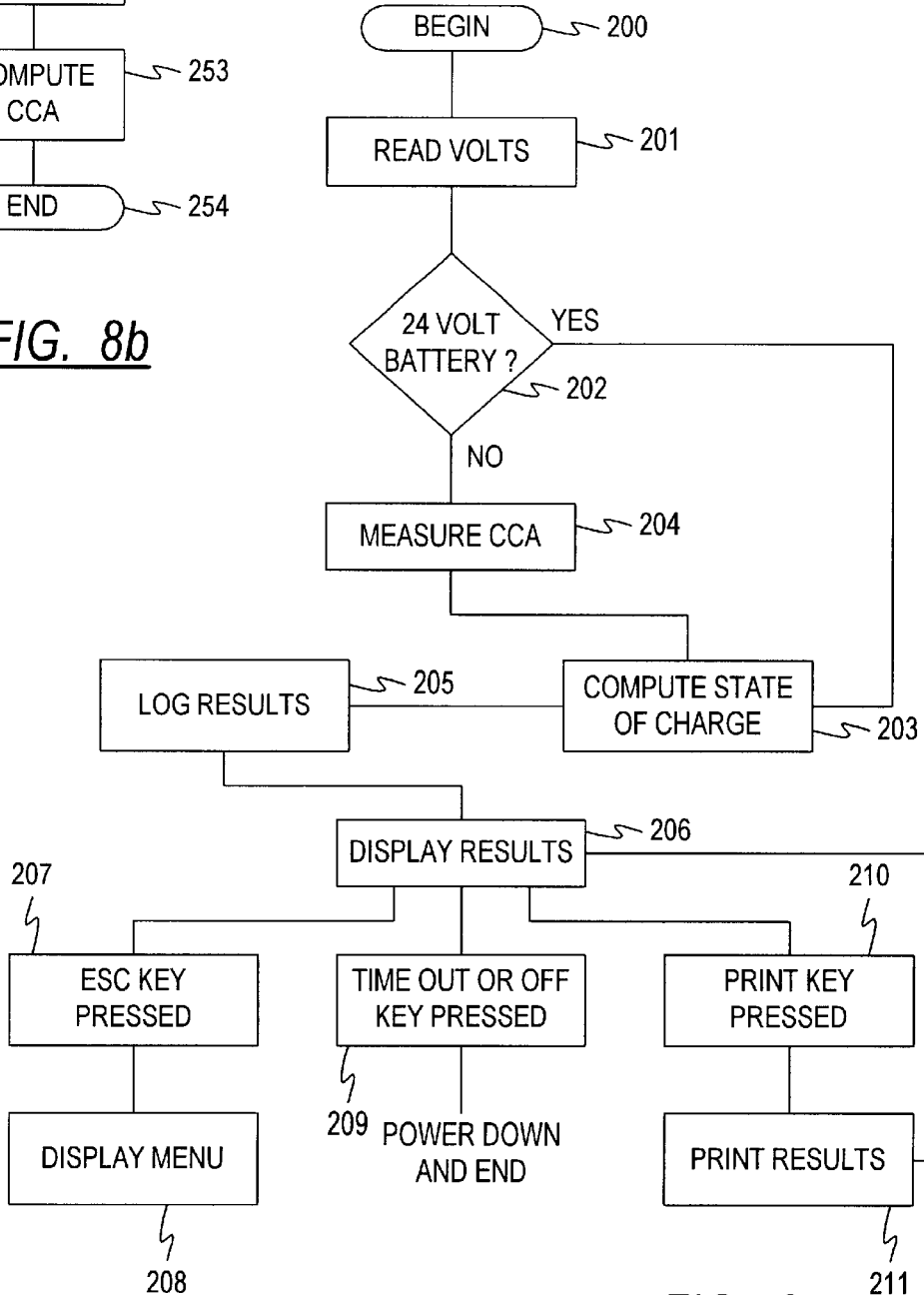
FIG. 8a is a flow chart of the "check battery" subroutine accessed by the program of FIG. 7.

The "check battery" subroutine, which is illustrated by the flow charts in FIGS. 8a and 8b and is entered at step 200 in FIG. 8a. The first step 201 of this subroutine reads and stores the BAT_VOLTS signal from the circuit 23. At this point there is no load connected to the battery, so the BAT_VOLTS signal represents the open-circuit voltage across the battery terminals. The system then advances to step 202 which determines whether the battery B being tested is a 24-volt battery by determining whether the voltage read at step 201 is above 17 volts. An affirmative answer means the battery is a 24-volt battery, and the system proceeds directly to step 203 to determine the state of charge of the battery (described below). A negative answer at step 202 means the battery is not a 24-volt battery, and the system advances to step 204 which calls the subroutine of FIG. 8b to compute the CCA of the battery.

The subroutine of FIG. 8b is entered at step 250 and begins pulsing the low-current load circuit 27 at step 251. Specifically, the FET 20 in the low-current load circuit 27 is turned on and off at a frequency of 100 cycles/second for two seconds for 12-volt batteries, or at a frequency of 50 cycles per second for two seconds for 6-volt batteries (whether the battery is a 6-volt or 12-volt battery is determined by whether the BAT_VOLTS signal is above or below 7.5 volts). After the two seconds of pulsing, the magnitude of the AC ripple is measured at step 252, in the same manner described above, and then the estimated CCA is computed at step 253 using the formula:

$$CCA_{est}=[CCA\ Coef+Temperature\ Coef.\times(70-Temperature)+Volt\ Coef.\times(12.68-Voltage)]/AC\ Ripple$$

The values of the three coefficients CCA Coef, Temperature Coef and Volt Coef in the above formula are determined empirically and stored in the program memory of the microprocessor. Typical values are as follows:

12-volt battery
CCA Coef=6750
Temperature Coef=3200
Volt Coef=16
6-volt Battery
CCA Coef=1900
Temperature Coef=970
Volt Coef-=4.8

The resulting CCA value is stored, and then the subroutine ends at step 254 and proceeds to step 203 where the state of charge of the battery is interpolated from the battery's beginning terminal voltage according to the following table from Battery Council International (BCI):

| Charge | 12-volt battery voltage |
| --- | --- |
| 100% | 12.65 |
| 75% | 12.45 |
| 50% | 12.24 |
| 25% | 12.06 |
| 0% | 11.89 |

The condition of the battery B is then evaluated using the following logic (for a 12-volt battery):

If the CCA is less than 40 amps, report BAD BATTERY

Otherwise, if the voltage is above 12.25 volts, report CONTINUE TESTING

Otherwise, if the voltage is above 10.80 volts, report CHARGE & TEST

Otherwise, if the voltage is below 9.80 volts, report CHARGE & TEST

Otherwise, if the voltage is between 9.80 and 10.80 volts, report BAD CELL

In any of the above examples for a 12-volt battery, the voltages can be divided by two for 6-volt batteries and multiplied by two for 24-volt batteries.

The appropriate report from the above logic is logged in the nonvolatile memory at step 205, and then displayed on the LCD at step 206. After the results of the battery check have been displayed at step 206, the system displays the options menu again at step 208 if the escape key 16 is pressed (as detected at step 207), prints the displayed results at step 210 if the print key 12 is pressed (as detected at step 209), or turns off at step 211 if the off key 11 is pressed or after a two-minute timeout period if the user does nothing.

Figure 9:
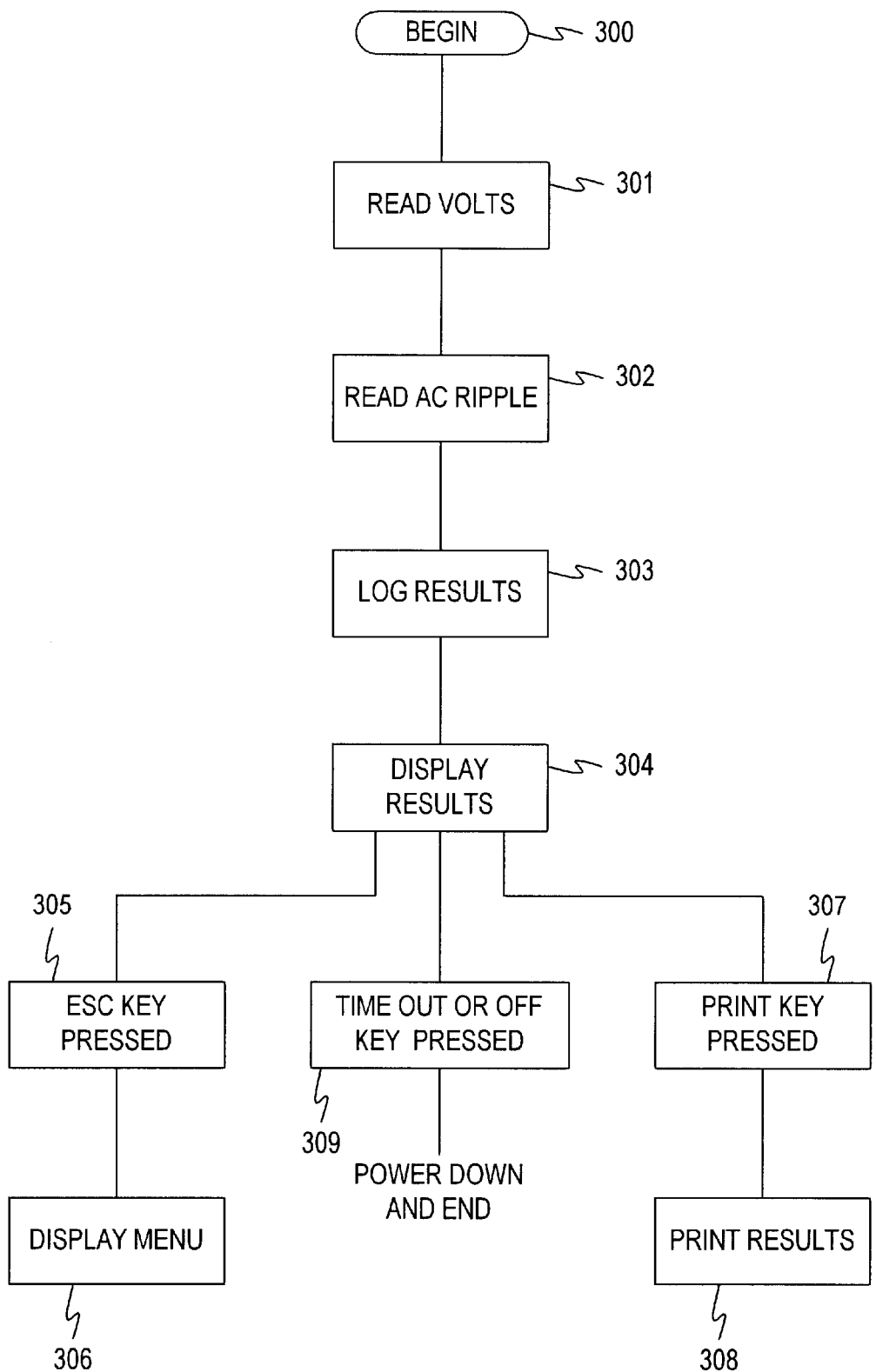
FIG. 9 is a flow chart of the "check alternator" subroutine accessed by the program of FIG. 7.

If the "check alternator" option is selected when the options menu is displayed at step 105 of the main program, the subroutine of FIG. 9 is called and is entered at step 300. The first step 301 of this subroutine reads and stores the BAT_VOLTS signal, and then reads and stores the AC_VOLTS signal at step 302. The system then advances to step 303 which logs the read values of the two signals along with an evaluation based on those values. Specifically, if the regulation voltage is less than 13.0 volts, the evaluation is "LOW REGULATION," and if the voltage is greater than 15.0 volts, the evaluation is "HIGH REGULATION." Otherwise the evaluation is "GOOD REGULATION." If the AC ripple is greater than 50 mv, an additional evaluation of "BAD DIODE" is logged. The logged values and evaluations are all stored in the non-volatile memory 29, and are displayed on the LCD 17 at step 304.

After the results of the alternator check have been displayed at step 304, the operation is identical to that described above for the "check battery" subroutine, i.e., the system displays the menu again at step 306 if the escape key 16 is pressed (as detected at step 305), prints the displayed results at step 308 if the print key 12 is pressed (as detected at step 307), or turns off at step 309 if the on/off key 11 is pressed or after a two-minute timeout period if the user does nothing.

Figure 10:
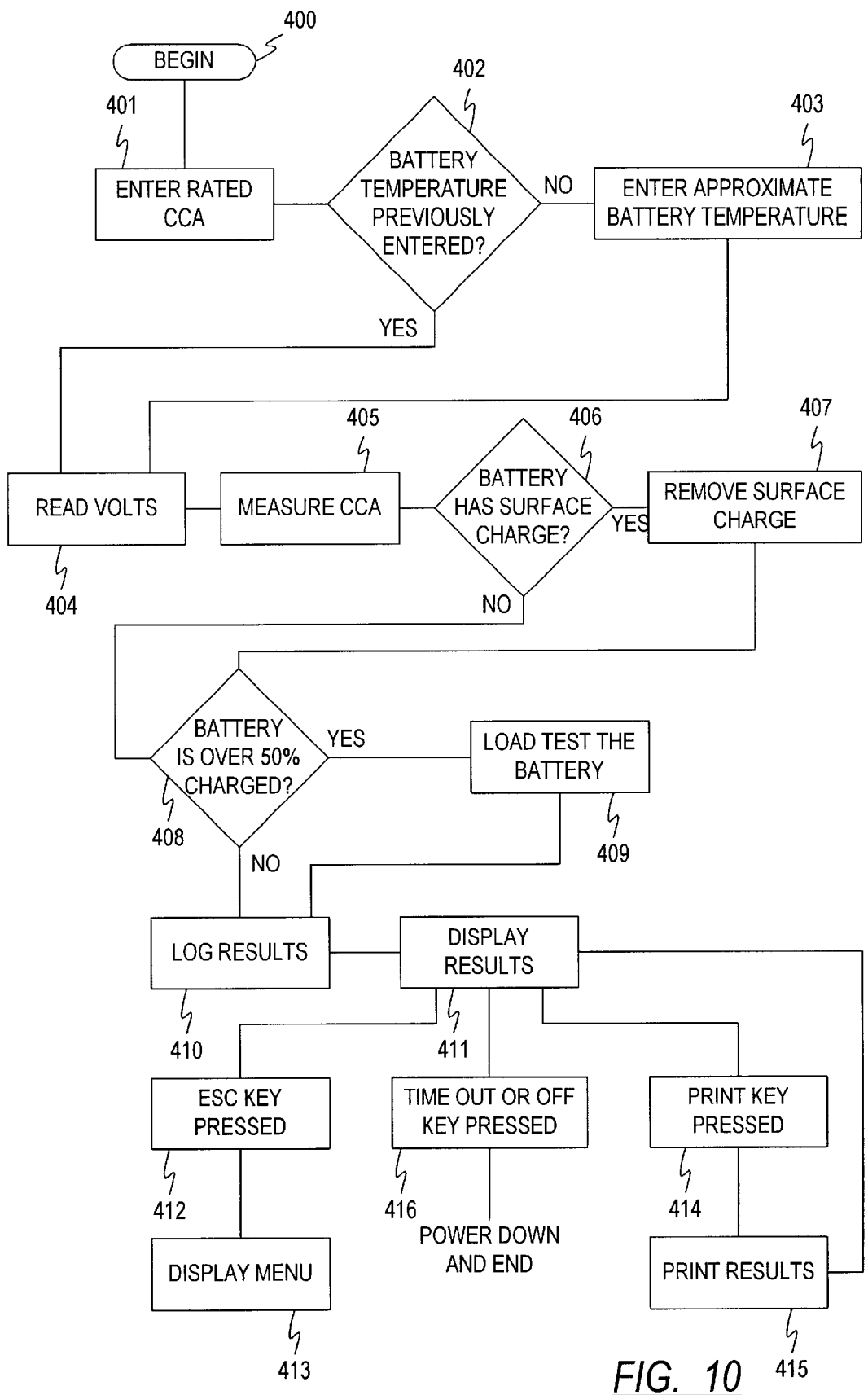
FIG. 10 is a flow chart of the "battery test" subroutine that is accessible by manual selection from a menu generated by the program of FIG. 7.

If the "battery test" option is selected when the menu is displayed at step 102 of the main program, the subroutine of FIG. 10 is called and is entered at step 400. The first step 401 of this subroutine displays a message that prompts the user to set the rated CCA of the battery B by adjusting the displayed value with the up and down keys 13 and 14 and then pressing the enter key 15. Step 402 then checks the microprocessor memory to determine whether the battery temperature has been previously entered. If not, the user is prompted at step 403 to enter the approximate battery temperature, as described previously. After entry of the battery temperature, or if step 402 determines that the temperature has been previously entered, the system advances to step 404 where the BAT_VOLTS signal is read and stored. At this point there is no load connected to the battery, so the BAT_VOLTS signal represents the open-circuit voltage across the battery terminals.

At step 405, the microprocessor computes the estimated CCA of the battery by calling the subroutine of FIG. 8*b*.

Then at step 406 the open circuit voltage is used to determine whether the battery has a surface charge by determining whether the voltage read at step 404 is greater than 12.8 volts. If it does, the surface charge is removed at step 407 by cycling the loads in the 200-amp load bank 28 so that one load at a time is connected to the battery for a 2.5-second interval, followed by a 3-second delay, followed by connection of another load to the battery. Specifically, each of the three resistors R21–R23 is connected to the battery for about 0.1 second each (drawing about 70 amps) in sequence, and this cycle is repeated throughout the 2.5-second interval. At the end of the 2.5-second interval, no load is connected to the battery during the 3-second delay, and then the magnitude of the BAT_VOLTS signal is checked at the end of the delay interval to determine whether the battery voltage has dropped below 12.75 volts. This process is repeated, up to a maximum of three times, until a BAT_VOLTS value of less than 12.75 volts is measured at the end of one of the 3-second delay intervals.

After the surface charge has been removed at step 407, or if the battery was determined to have no surface charge at step 406, the system determines whether the battery is over 50% charged at step 408. If the answer is affirmative, the battery is load tested at step 409, and then the results are evaluated and logged at step 410 and displayed at step 411. For the load test at step 409, all three load resistors in the 200-amp load bank 28 are connected to the battery for 1.5 seconds if the beginning battery voltage (read at step 404) is greater than 12.44 volts, or for one second if the beginning battery voltage is greater than 12.25 volts but less than 12.44 volts. The pass voltage for the load test is based on the rated CCA entered at step 401, as follows Pass voltage=(Rated CCA×0.002)+8.85.

If the answer at step 408 is negative, meaning the battery is less than 50% charged, the results are evaluated and logged at step 410 and displayed at step 411 without carrying out the load test.

The evaluation of the results at step 410 is carried out according to the following logic:

---

If the beginning voltage was above 12.25:
  If the loaded voltage was above the pass voltage:
    If the beginning voltage was above 13.0:
      Compare the estimated CCA to the rated CCA:
        If the estimated CCA is above 87% the battery is GOOD.
        If the estimated CCA is between 75% and 87% the battery is MARGINAL.
        If the estimated CCA is below 75% the battery is BAD.
    If the beginning voltage was between 12.25 and 13.0:
      Compare the estimated CCA to the rated CCA:
        If the estimated CCA is above 80% the battery is GOOD.
        If the estimated CCA is between 70% and 80% the battery is MARGINAL.
        If the estimated CCA is below 70% the battery is BAD.
  If the loaded voltage was below the pass voltage:
    The battery is BAD.
If the beginning voltage was between 10.80 and 12.25:
  Compare the estimated CCA to the rated CCA:
    If the estimated CCA is between 80% and 20% the battery must be charged and retested.
    If the estimated CCA is less than 20% the battery is BAD.
If the beginning voltage was between 9.80 ad 10.80:
  The battery has a BAD CELL.
If the beginning voltage was below 9.80:
  The battery is BAD.

---

After the results of the battery evaluation have been displayed at step 411, the operation is identical to that described above for the "check battery" subroutine, i.e., the system displays the menu again at step 413 if the escape key 16 is pressed (as detected at step 412), prints the displayed results at step 415 if the print key 12 is pressed (as detected at step 414), or turns off at step 416 if the on/off key 11 is pressed or after a two-minute timeout period if the user does nothing.

Figure 11:
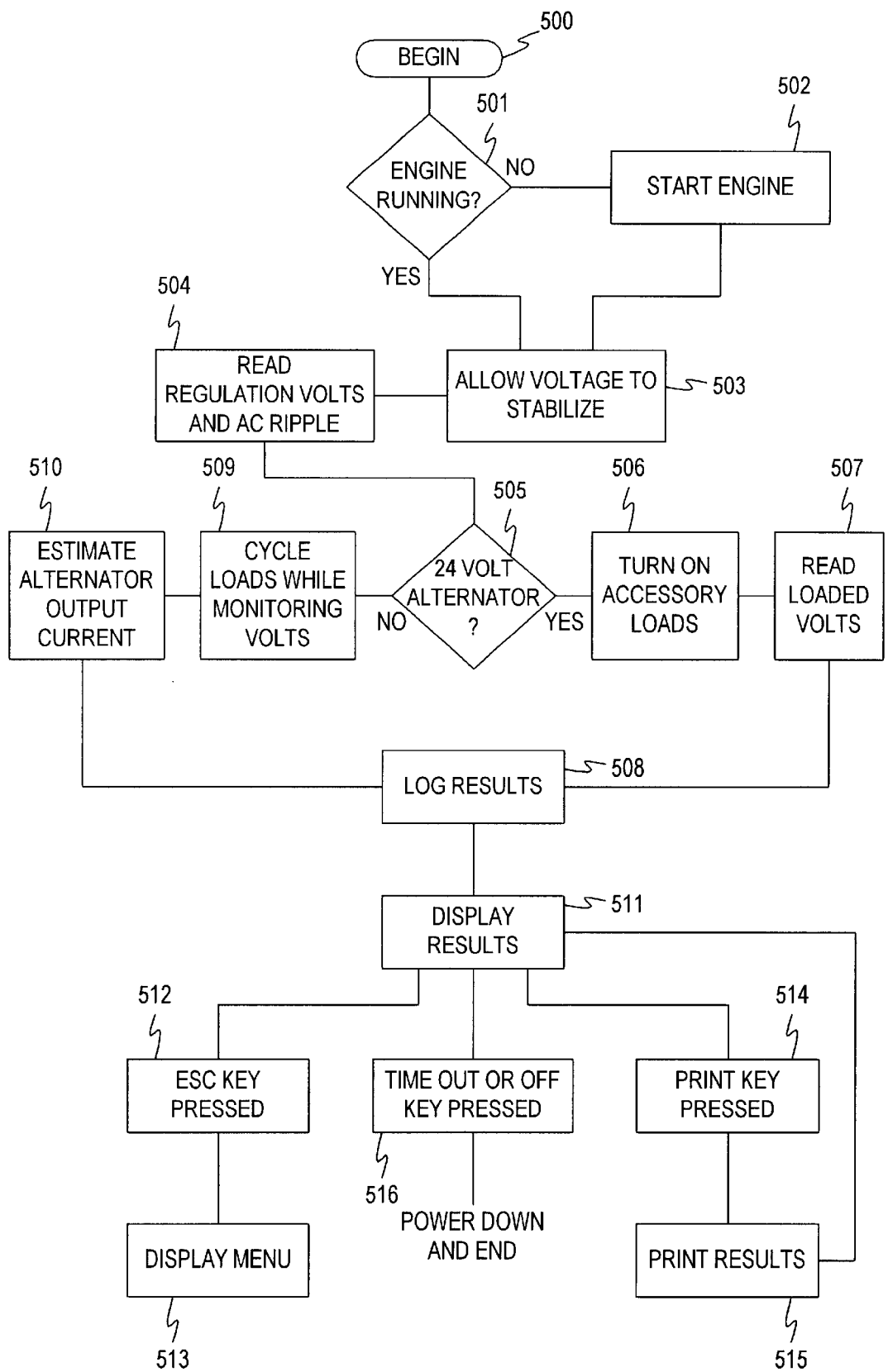
FIG. 11 is a flow chart of the "alternator test" subroutine that is accessible by manual selection from a menu generated by the program of FIG. 7.

If the "alternator test" option is selected from the options menu displayed at step 102 of the main program in FIG. 7, the subroutine of FIG. 11 is called and is entered at step 500. The first step 501 of this subroutine determines whether the engine is running in the same manner described above for step 105 of the main program in FIG. 7. If the answer is negative, the user is prompted to start the engine by a "start engine" message displayed on the LCD 17 at step 502. After the engine has been started, or if it already running as determined by an affirmative response at step 501, the BAT_VOLTS signal is allowed to stabilize at step 503. Specifically, the value of BAT_VOLTS is displayed along with a message advising the user to "allow voltage to stabilize" and then press the "yes" key to continue.

After the voltage has stabilized, both the BAT_VOLTS signal and the AC_VOLTS signal are read at step 504 and used at step 505 to determine whether the alternator is a 24-volt alternator by determining whether the value of BAT_VOLTS is above 17 volts. If the answer is affirmative, the user is prompted at step 506 to turn on the accessory loads such as the headlights, air conditioner or heater, radio, etc. The value of the BAT_VOLTS signal is then read at step 507, and the test results are evaluated and logged at step 508.

If it is determined at step 505 that the alternator is not a 24-volt alternator, then the high-current load 28 is cycled on and off at step 509. Specifically, one of the switching transistors FET2, FET3 or FET4 in the high-current load circuit is turned on if the BAT_VOLTS signal is greater than 12.8 volts, and is turned off if the BAT_VOLTS signal drops below 12.8 volts. This cycling is continued for 5 seconds while keeping track of the number of times the load is turned on. At the end of the 5-second load-cycling interval, the estimated alternator output current is computed at step 510. If the load was on during the entire 5 seconds, then the alternator output current is estimated to be greater than 60 amps. If the load was on during only a portion of the 5 seconds, then the alternator output current is estimated to be:

40×(% time load was on)+20

The 20 in the above formula accounts for the "key draw" of current in an automotive electrical system. The test results are evaluated and logged at step 508 and displayed at step 511. Specifically, the regulation voltage (BAT_VOLTS signal), AC ripple (AC_VOLTS signal) and the estimated alternator output current are logged and displayed along with an evaluation of whether the regulation is "low", "high" or "good" according to the following logic:

If the regulation voltage is below 13.0 volts, then the regulation is "low."

If the regulation voltage is above 15.0 volts, then the regulation is "high."

If the regulation voltage is between 13.0 and 15.0 volts, then the regulation is "good."

The logged and displayed results also include a "bad diode" indication if the AC ripple was greater than 50 mv. The "bad diode" indication means that the alternator should be replaced because the stator diodes are bad, which can cause a slight drain on the alternator output as well as causing other diodes to fail, eventually resulting in a failed alternator or dead battery. A "high" regulation can damage the system and thus indicates that the alternator should be repaired or replaced.

After the results of the alternator test have been displayed at step 511, the operation is identical to that described above for the "check battery" subroutine, i.e., the system displays the menu again at step 513 if the escape key 16 is pressed (as detected at step 512), prints the displayed results at step 515 if the print key 12 is pressed (as detected at step 514), or turns off at step 516 if the on/off key 11 is pressed or after a two-minute timeout period if the user does nothing.

Figure 12:
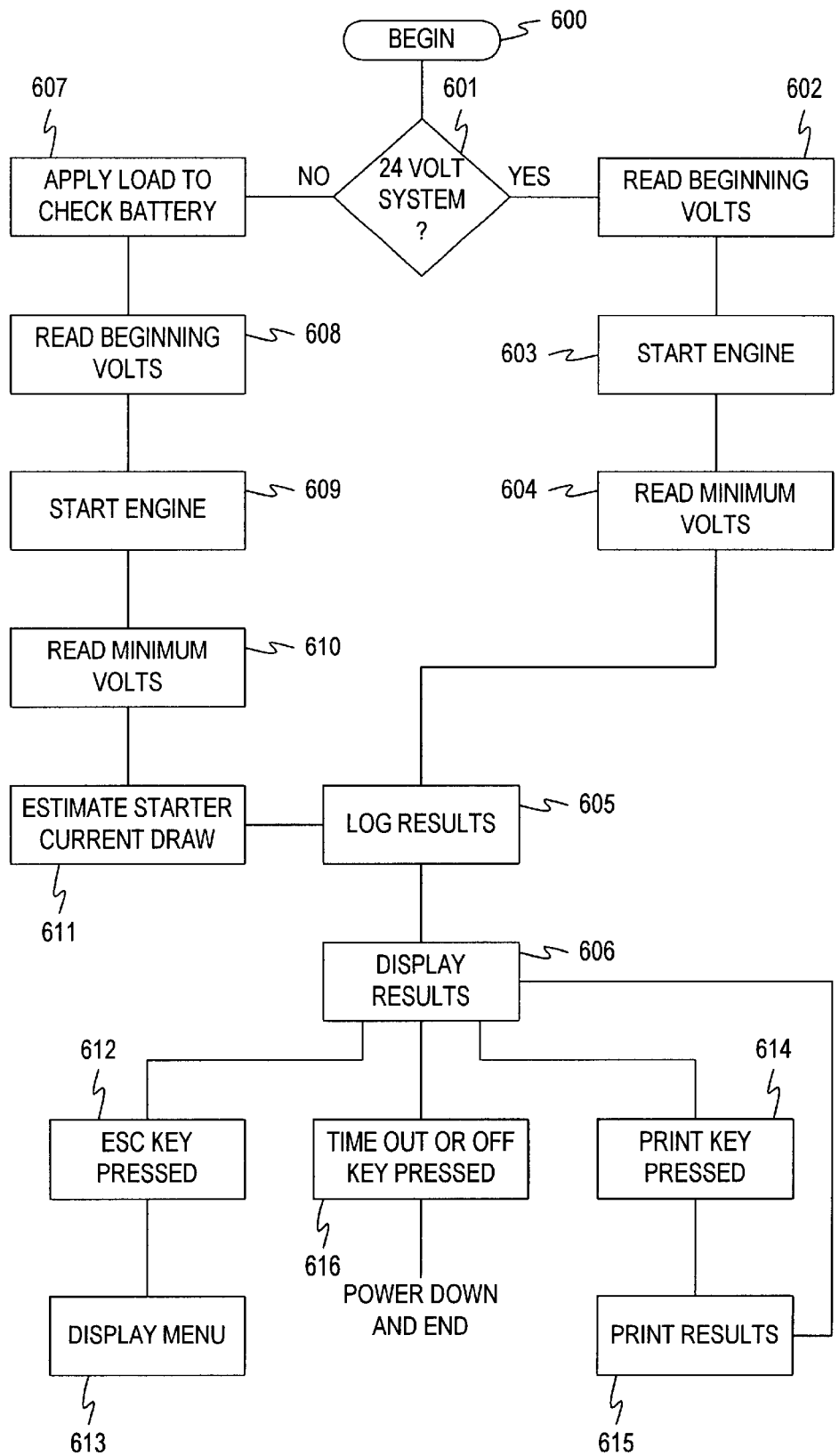
FIG. 12 is a flow chart of the "starter test" subroutine that is accessible by manual selection from a menu generated by the program of FIG. 7.

If the "starter test" option is selected from the options menu displayed at step 102 of the main program in FIG. 7, the subroutine of FIG. 12 is called and is entered at step 600. The first step 601 of this subroutine determines whether the system is a 24-volt system in the same manner described above for step 505 of the "alternator test" subroutine in FIG. 11. If the answer is affirmative, the value of the BAT_VOLTS signal is read at step 602 to determine the beginning voltage of the battery. Then the user is prompted to start the engine by a message displayed at step 603, and the minimum value of the BAT_VOLTS signal is read at step 604 while the engine is being started. The beginning and minimum voltages are logged at step 605 and then displayed at step 606.

If step 601 determines that the alternator is not a 24-volt alternator, then step 607 turns on all three FETs in the high-current load circuit 28 for one second, records the voltage drop, and uses the recorded voltage and known current (i.e. 200 amps) to compute the internal resistance of the battery. After the battery has been load tested at step 607, the same operations described above for steps 602–604 are carried out at steps 608, 609 and 610, respectively. The estimated starter current draw is then computed at step 611 using the following formula:

(Beginning voltage−Minimum voltage)/Resistance

The results are logged at step 605 and displayed at step 606. Once again, after the results of the "starter test" have been displayed at step 606, the operation is identical to that described above for the "check battery" subroutine, i.e., the system displays the menu again at step 613 if the escape key 16 is pressed (as detected at step 612), prints the displayed results at step 615 if the print key 12 is pressed (as detected at step 614), or turns off at step 616 if the on/off key 11 is pressed or after a two-minute timeout period if the user does nothing.

Figure 13:
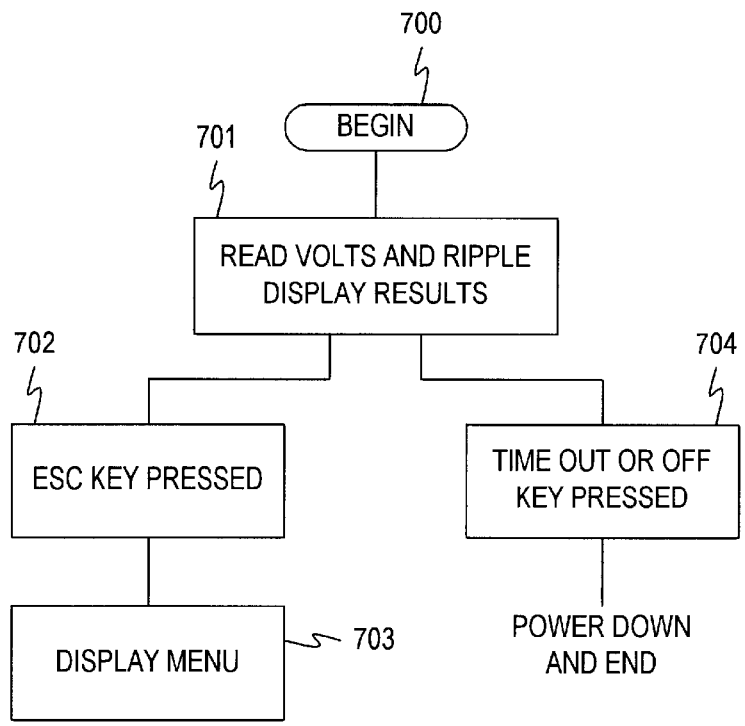
FIG. 13 is a flow chart of the "voltmeter" subroutine that is accessible by manual selection from a menu generated by the program of FIG. 7.

If the "volt meter" option is selected from the options menu displayed at step 102 of the main program in FIG. 7, the subroutine of FIG. 13 is called and is entered at step 700. The first step 701 of this subroutine reads the value of the BAT_VOLTS signal and the AC_VOLTS signal and displays the results. Then if the escape key 16 is pressed, this event is detected at step 702 and the main menu is displayed at step 703. If the escape key is not pressed, the system turns off at step 704 if the on/off key 11 is pressed or after a two-minute timeout period if the user does nothing.

Figure 14:
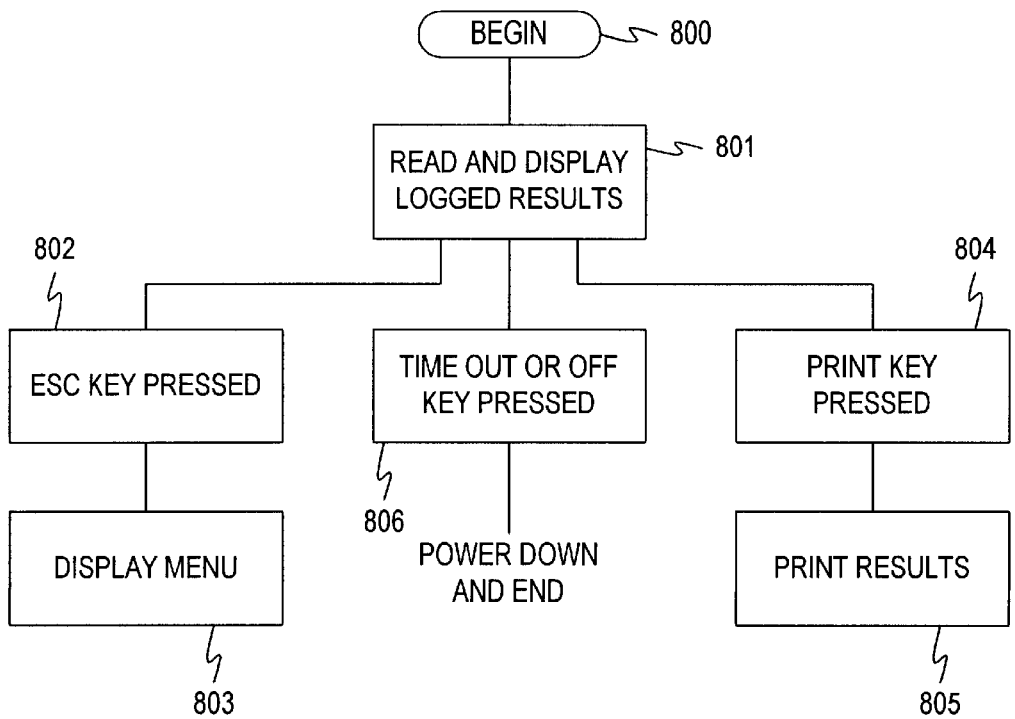
FIG. 14 is a flow chart of the "review/print" subroutine that is accessible by manual selection from a menu generated by the program of FIG. 7.

If the "review/print" option is selected from the menu displayed by the main program in FIG. 7, the subroutine of FIG. 14 is called and is entered at step 800. The first step 801 of this subroutine reads and displays the logged results of the last test. The up and down keys 13 and 14 can then be pressed by the user to increment or decrement to the desired test. Then again the operation is identical to that described above for the "check battery" subroutine, i.e., the system displays the main menu again at step 803 if the escape key 16 is pressed (as detected at step 802), prints the displayed results at step 805 if the print key 12 is pressed (as detected at step 804), or turns off at step 806 if the on/off key 11 is pressed or after a two-minute timeout period if the user does nothing. Coupling to a printer is effected by an infrared coupler 99 mounted in the upper end of the tester (see FIGS. 1 and 3).

Figure 15:
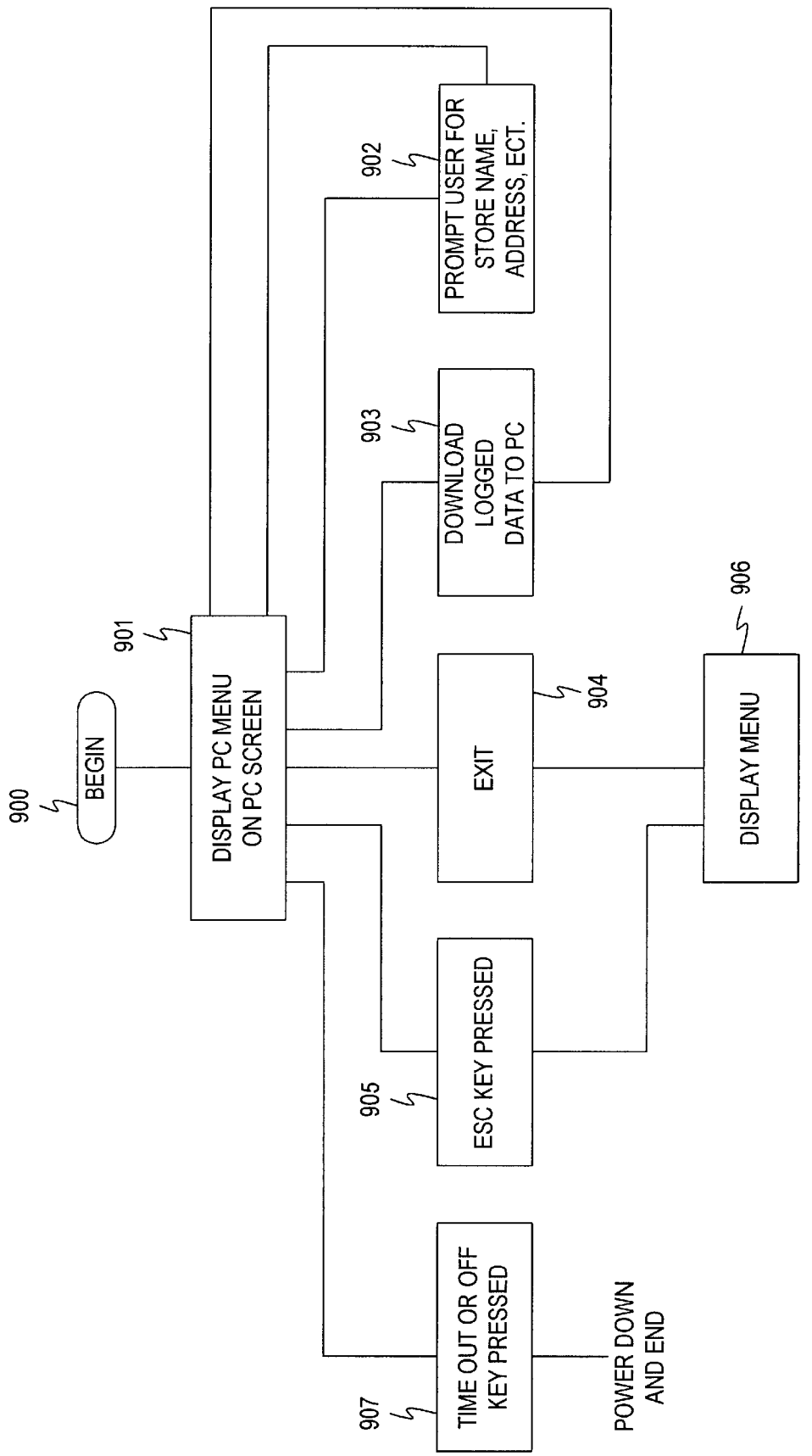
FIG. 15 is a flow chart of the "communicate with PC" subroutine that is accessible by manual selection from a menu generated by the program of FIG. 7.

If the "download/setup" option is selected from the options menu displayed at step 102 of the main program in FIG. 7, the subroutine of FIG. 15 is called and is entered at step 900. The first step 901 of this subroutine displays a message prompting the user to connect the unit to a PC if the unit is not already so connected. Connection to a PC is effected by inserting a stereo plug on an adapter cord into a jack 98 in the upper end of the tester, and plugging a serial adapter on the other end of the cord into a serial port in the PC. When the unit is connected to a PC, the test results stored in the hand-held tester can be downloaded to the PC at step 903 using a program in the PC such as "Windows 98 Hyper Terminal." The user may also enter a name and address at step 902 which is stored in the nonvolatile memory 29 and printed at the top of a printout when the user prints the results to the portable infrared printer via the infrared communication port 99.

If at any time the exit key of the PC or the escape key 16 of the test unit is pressed, that event is detected at step 904 or 905, and the main menu is displayed at step 906. The test unit turns off at step 907 if the on/off key 11 is pressed or after a two-minute timeout period if the user does nothing.

Figure 16:
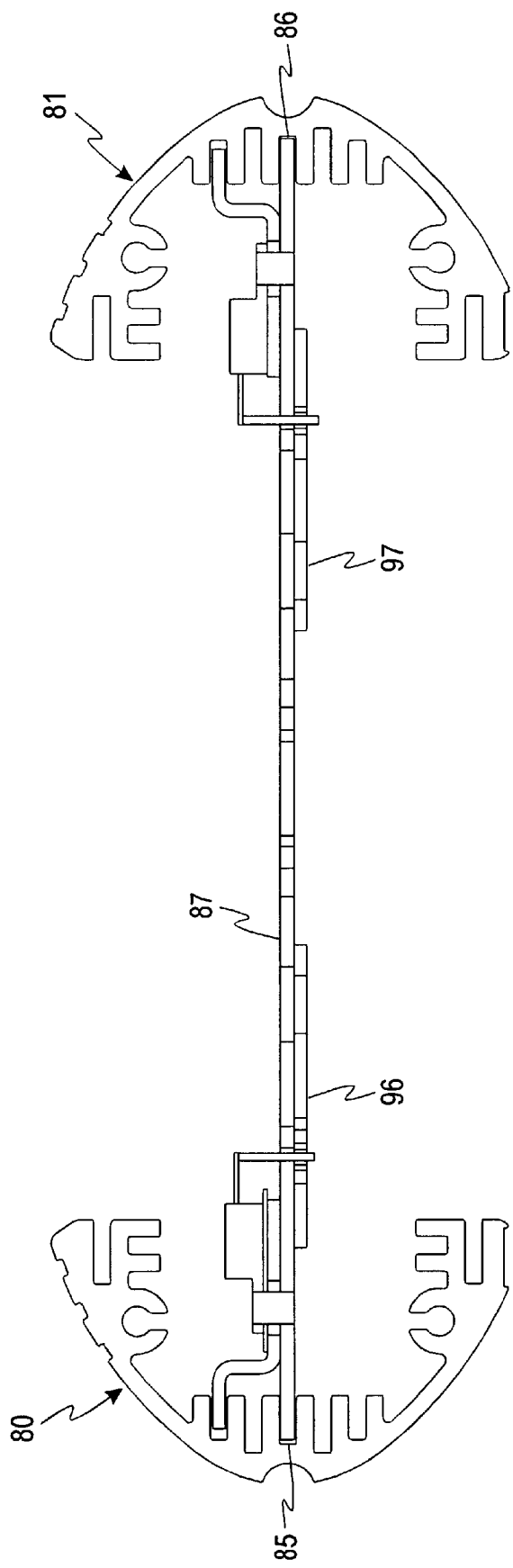
FIG. 16 is a sectional view taken transversely through the lower half of the testing unit shown in FIG. 1.
Figure 18:
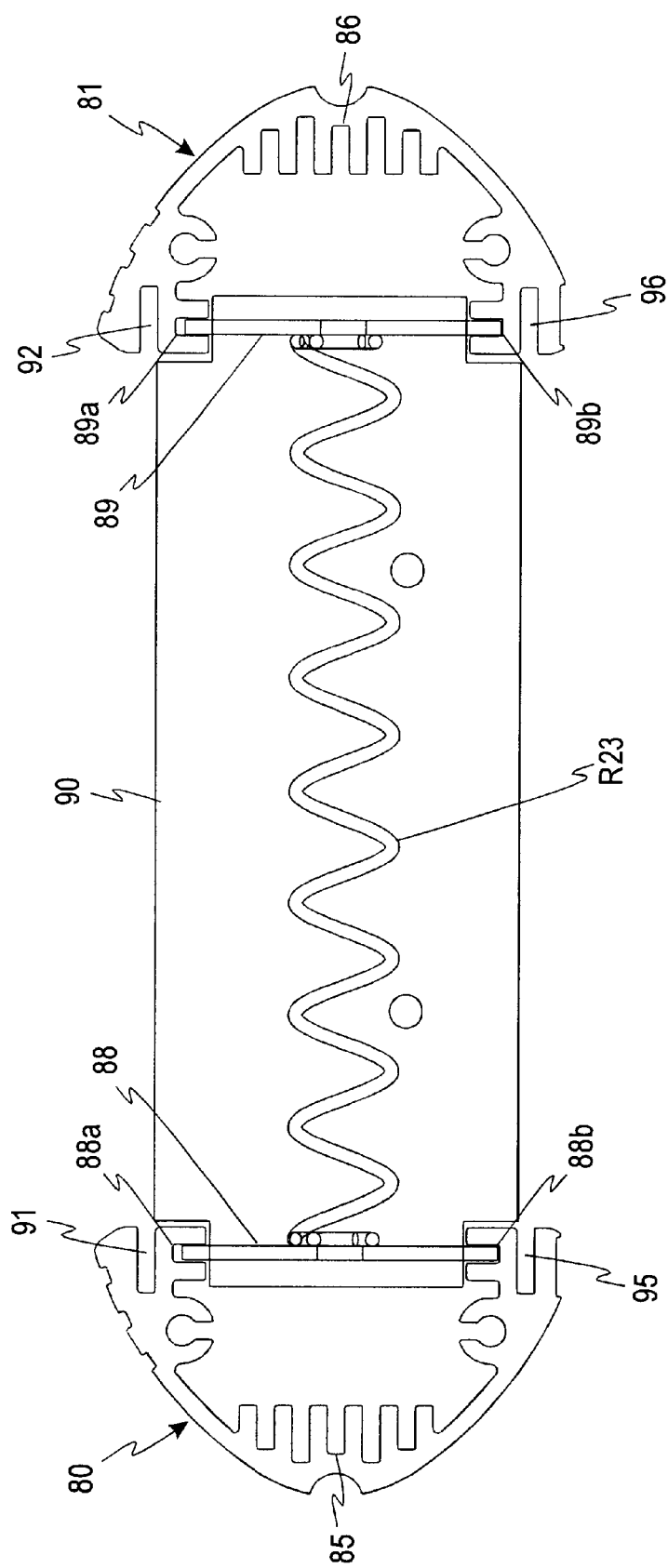
FIG. 18 is a sectional view taken transversely through the upper half of the testing unit shown in FIG. 1.
Figure 20:
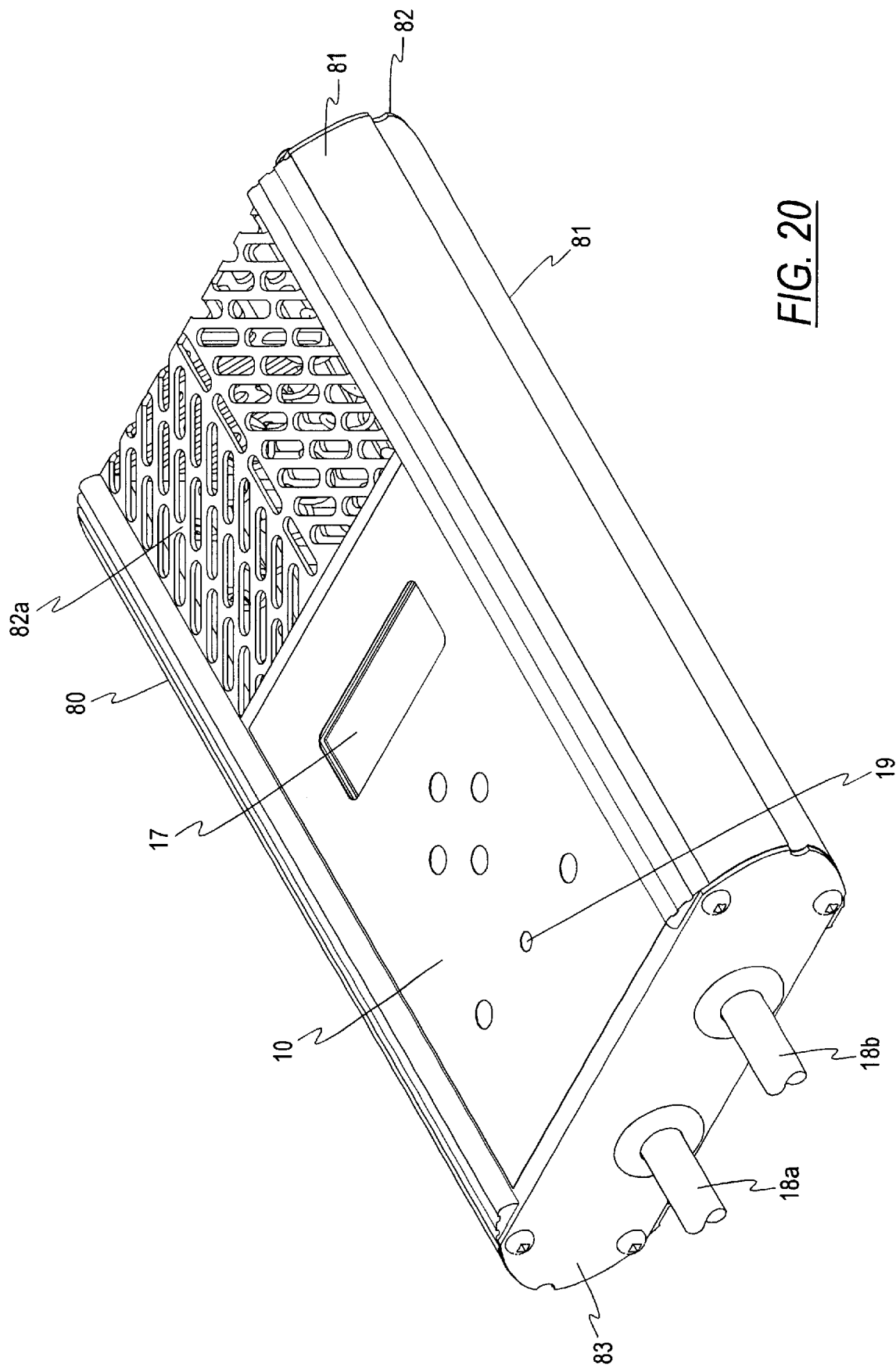
FIG. 20 is a perspective front view of the analyzer shown in FIG. 1 without the keys, taken from the lower end of the unit.

Structurally, the tester of FIG. 1 includes a strong, durable housing formed by a pair of extruded aluminum side members 80 and 81 joined at opposite ends by a pair of end plates 82 and 83 attached to the side members 80, 81 by multiple screws 84 (see FIGS. 1 and 20). The interior surfaces of the two side members 82, 83 form elongated slots 85 and 86 (FIG. 16) for receiving and supporting a printed circuit board 87 that carries all the electronic circuitry except for the three large resistors R21−R23 that form the high-current load for the battery under test. Because of the high current levels, these resistors R21−R23 dissipate a substantial amount of heat, and thus they are mounted in a ventilated end portion of the housing away from the printed circuit board 87. The ends of the three resistors R21−R23 are connected to a pair of insulating mounting plates 88 and 89 that fit into mating slots 88a, 88b and 89a, 89b formed in the interior surfaces of the respective side members 80, 81 (see FIG. 18). A third plate 90 extends across the upper end of the printed circuit board 87 and overlaps the lower ends of the plates 88 and 90. The mounting plates 88, 89 and the third plate 90 combine to form an effective heat shield from the heat dissipated in the resistors R21−R23 during high-current load testing of a battery.

The bottom U-shaped panel 10 (FIGS. 1 and 20) fits into two pairs of elongated slots 91, 92 and 95, 96 (see FIG. 18) formed in the interior surfaces of the two side members 80 and 81. The panel 10 extends from the lower ends of the side members 80, 81 to at least the upper end of the printed circuit board 87. Similarly, a vented U-shaped top panel 82 fits into the other ends of the two pairs of elongated slots 91, 92 and 95, 96 formed in the interior surfaces of the side members 80 and 81 and extends to meet the bottom panel 10. The entire top panel 82, including the two extensions 82a and 82b, is apertured (see FIGS. 1 and 20) to facilitate the dissipation of heat from the three resistors R21−R23.

Figure 17:
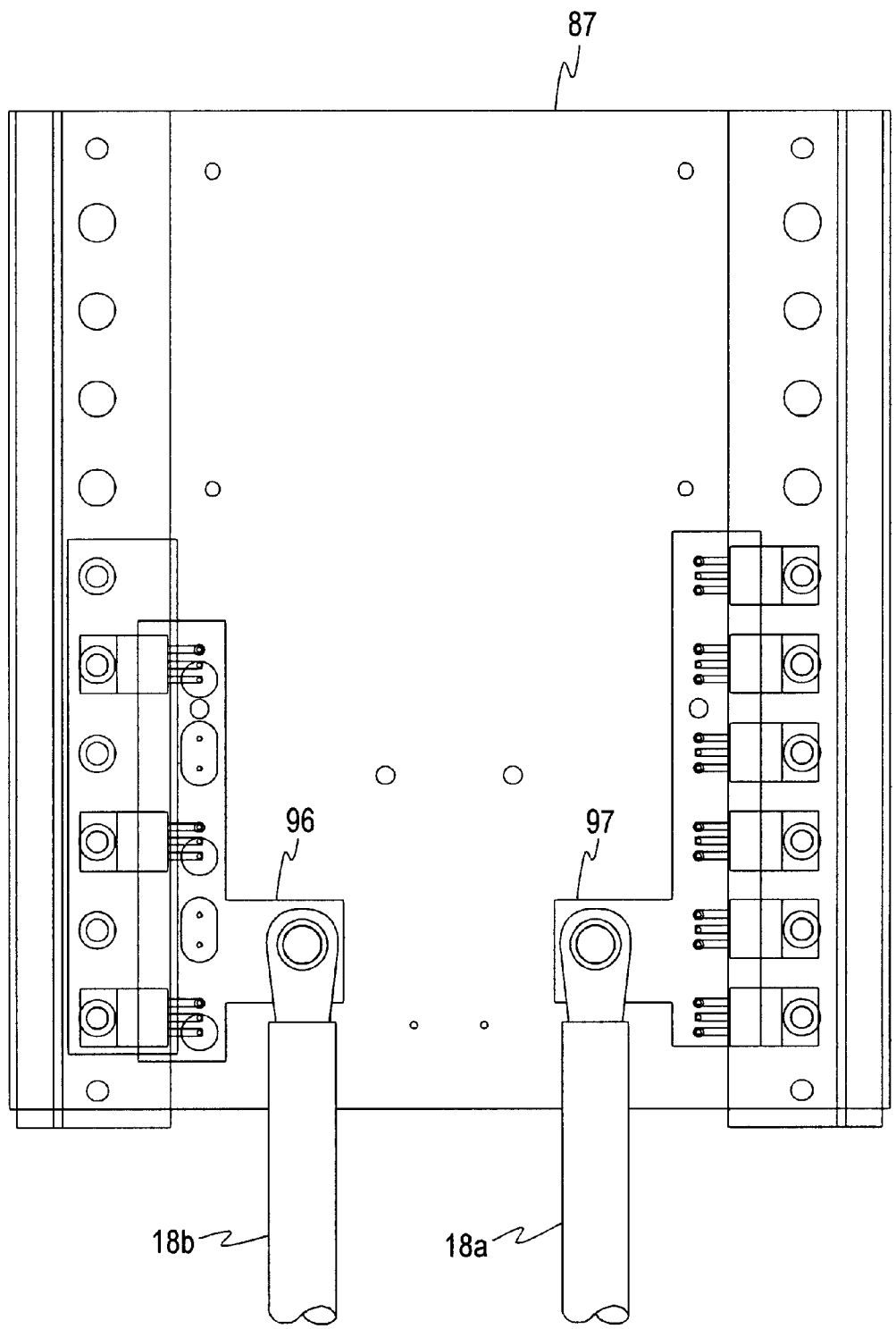
FIG. 17 is a bottom plan view of the printed circuit board included in the sectional view of FIG. 16.
Figure 19:
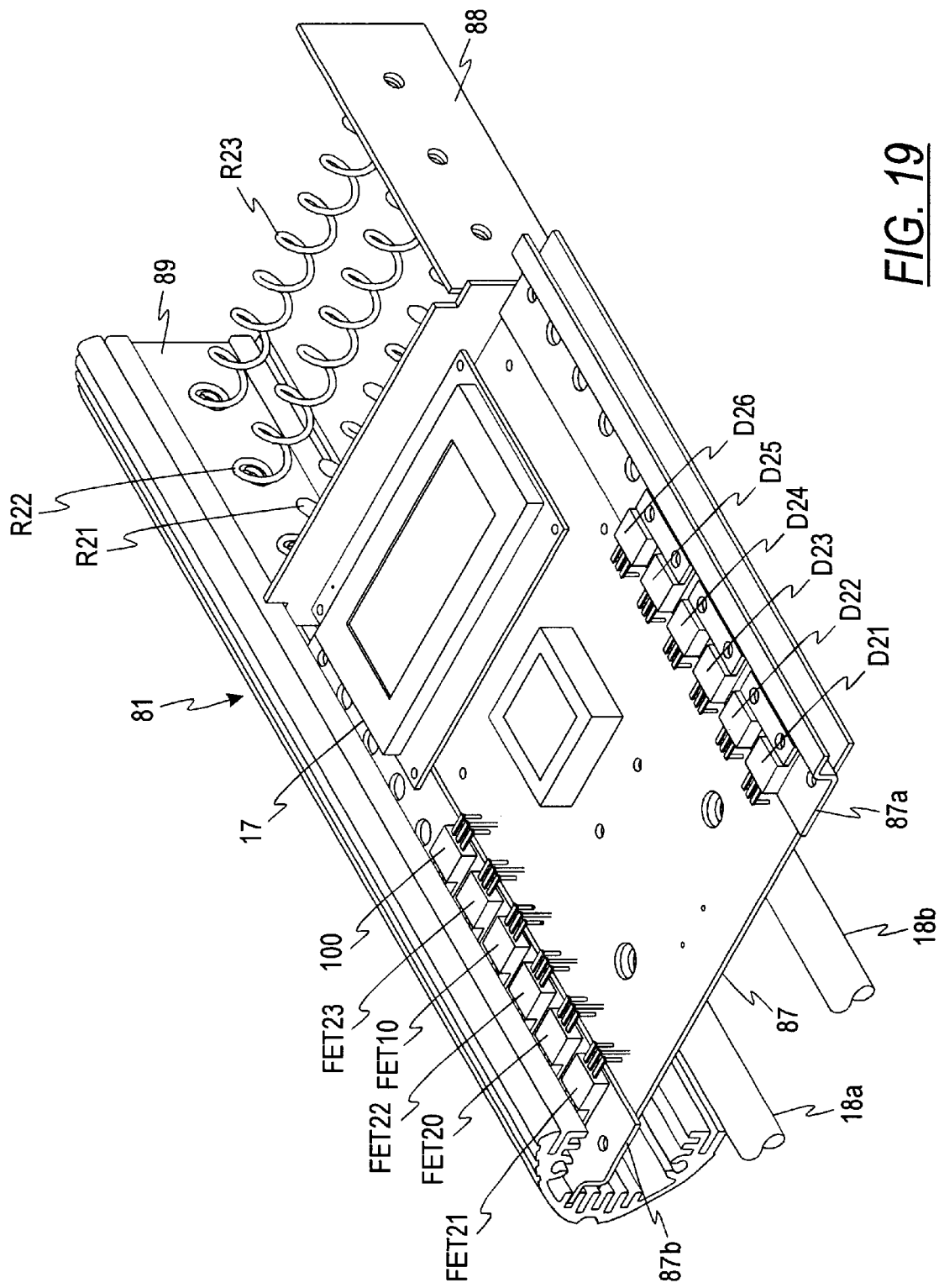
FIG. 19 is a perspective front view of the internal structure of the testing unit shown in FIG. 1, showing the top surface of the printed circuit board and only one side wall of the housing.

As can be seen in FIGS. 17 and 19, the printed circuit board 87 carries two rows of TO-220 packaged devices, including the switching transistors FET10, FET20, FET21−23 and the voltage regulator 100 and the diodes D21−D26, mounted along opposite edges of the board 87. These TO-220 packaged devices are mounted on a pair of aluminum strips 87a and 87b that overlap the edge portions of the printed circuit board 87 and extend into mating slots in the side members 80 and 81 (see FIG. 19) to assist in dissipating heat from the components, especially when the 200-amp load is being utilized.

The two cables 18a and 18b that connect the test circuitry to the battery B are connected to copper plates 96 and 97 near the lower end of the printed circuit board 87, as can be seen in FIG. 17. These copper plates 96 and 97 mount to the back of the printed circuit board 87 and carry the high current that flows through the diodes D21−26, the loads R21−23 and the transistors FET21−23 to the cables 18a and 18b. These copper plates permit the use of small components such as the TO-220 packaged devices, despite the high current levels.

While the present invention has been described with reference to one or more particular embodiments, those skilled in the art will recognize that many changes may be made thereto without departing from the spirit and scope of the present invention, which is set forth in the following claims.

What is claimed is:

1. A method of testing a lead-acid battery comprising
   measuring the beginning voltage across the terminals of the battery in the absence of a load,
   connecting the battery to a first load, measuring the AC ripple in the output current drawn from the battery by the first load, and computing an estimated CCA of the battery using said beginning voltage and AC ripple,
   connecting the battery to a second load that draws more current from the battery than said first load and measuring the loaded voltage of the battery, and evaluating the condition of the battery at least in part on the basis of said beginning voltage, said loaded voltage and said estimated CCA.

2. The method of claim 1 in which the battery voltage is measured and used in computing said estimated CCA.

3. The method of claim 1 which includes interpolating the state of charge of the battery on the basis of said beginning voltage.

4. The method of claim 1 which includes preliminarily evaluating the condition of the battery on the basis of said beginning voltage of the battery.

5. The method of claim 1 which includes preliminarily evaluating the condition of the battery on the basis of said estimated CCA of the battery.

6. The method of claim 1 which includes using the rated CCA to compute a "pass voltage" that is used in evaluating the condition of the battery.

7. The method of claim 6 in which said pass voltage is computed as (rated CCA×0.002)+8.85.

8. The method of claim 1 which includes determining the estimated CCA of the battery, and using the rated CCA in evaluating the condition of the battery.

9. The method of claim 1 which includes determining whether the battery has a surface charge, and if the answer is affirmative, removing the surface charge.

10. The method of claim 9 in which the surface charge is removed by connecting the battery to a load repeatedly for selected time intervals until said battery voltage drops below a predetermined voltage.

11. The method of claim 1 which includes determining the estimated CCA of the battery, and comparing said estimated CCA of the battery with the rated CCA of the battery as a part of the evaluation of the condition of the battery.

12. The method of claim 1 which includes comparing said loaded voltage with a "pass voltage" that is a function of the rated CCA of the battery.

13. The method of claim 1 which includes determining the estimated CCA of the battery, determining a "pass voltage" as a function of the rated CCA, and in which the battery is evaluated as "good" if
said loaded voltage is greater than said pass voltage, said beginning voltage is greater than 13 volts, and said estimated CCA is greater than 87% of the rated CCA, or
said loaded voltage is greater than said pass voltage, said beginning voltage is between 12.25 and 13 volts, and said estimated CCA is greater than 80% of the rated CCA, or
said beginning voltage is between 10.8 and 12.25 volts and said estimated CCA is greater than 80% of the rated CCA, or "marginal" if
said loaded voltage is greater than said pass voltage, said beginning voltage is greater than 13 volts, and said estimated CCA is between 75% and 87% of the rated CCA, or
said loaded voltage is greater than said pass voltage, said beginning voltage is between 12.25 and 13 volts, and said estimated CCA is between 70% and 80% of the rated CCA, or "bad" if
said loaded voltage is greater than said pass voltage, said beginning voltage is greater than 13 volts, and said estimated CCA is less than 75% of the rated CCA, or
said loaded voltage is greater than said pass voltage, said beginning voltage is between 12.25 and 13 volts, and said estimated CCA is less than 70% of the rated CCA, or said loaded voltage is less than said pass voltage and said beginning voltage is greater than 12.25 volts, or
said beginning voltage is between 10.8 and 12.25 volts and said estimated CCA is less than 20% of the rated CCA, or
said beginning voltage is less than 9.8 volts, or
"bad cell" if said beginning voltage is between 9.8 and 10.8 volts, or "charge and re-test" if said beginning voltage is between 10.8 and 12.25 volts and said estimated CCA is between 20% and 80% of the rated CCA.

14. The method of claim 1 which includes a method of testing an alternator that is part of a charging system for the battery being tested, said alternator also being connected to an engine, said method comprising
connecting the battery to a first load and measuring the voltage across the battery while said engine is running,
measuring the AC ripple voltage created by the alternator and present at the battery, and
evaluating the condition of the alternator on the basis of the measured regulation voltage and AC ripple voltage.

15. The method of claim 14 in which the alternator is evaluated as "low regulation" if the measured regulation voltage is less than 13 volts, or "high regulation" if the measured regulation voltage is greater than 15 volts, or "good regulation" if the measured regulation voltage is between 13 and 15 volts, or "bad diode" if the measured AC ripple is greater than 50 millivolts.

16. A hand-held battery tester for testing a lead-acid battery comprising
means for measuring the beginning voltage across the terminals of the battery in the absence of a load,
means for connecting the battery to a first load,
means for measuring the AC ripple in the output current drawn from the battery by the first load,
means for computing an estimated CCA of the battery using said beginning voltage and AC ripple,
means for connecting the battery to a second load that draws more current from the battery than said first load,
means for measuring the loaded voltage of the battery, and
means for evaluating the condition of the battery at least in part on the basis of said beginning voltage, said loaded voltage and said estimated CCA.

17. A hand-held battery tester as set forth in claim 16 wherein said first load comprises a low-current load and said second load comprises a high-current load, and further including at least one switch for connecting said battery to said first load or said second load.

18. A hand-held battery tester as set forth in claim 16 which includes a hand-held housing containing said test load and means for receiving the output voltage of the battery.

19. A hand-held battery tester as set forth in claim 16 which includes a microprocessor and a program executable by said microprocessor for determining whether the tester is connected to a battery, determining whether the battery is connected to an alternator connected to a running engine, and, if the tester is connected to a battery but the battery is not connected to an alternator connected to a running engine, measuring the CCA and state of charge of the battery.

20. A hand-held battery tester as set forth in claim 19 wherein said program measures the battery voltage and AC ripple if the tester is connected to a battery and the battery is connected to an alternator connected to a running engine.

21. A hand-held battery tester as set forth in claim 16 which includes a microprocessor, a display controlled by said microprocessor, and a program executable by said microprocessor for testing a battery, for testing an alternator connected to the battery, for testing a starter connected to the battery, and for displaying a menu for selecting the type of test to be conducted.

22. A hand-held battery tester as set forth in claim 16 which includes a microprocessor, and a program executable by said microprocessor for determining whether the battery has a surface charge and, if the answer is affirmative, applying a load to the battery to remove the surface charge.

23. A hand-held battery tester as set forth in claim 16 which includes a microprocessor, and a program executable by said microprocessor for measuring the CCA of the battery and determining whether the battery is over 50% charged and, if the answer is affirmative, load testing the battery.

24. A hand-held battery tester as set forth in claim 16 which includes a microprocessor, and a program executable by said microprocessor for measuring the minimum output voltage of the battery during starting of an engine by a starter connected to said battery, and using that measurement to estimate the current draw of said starter.

25. A hand-held battery tester as set forth in claim 16 which includes a microprocessor, and a program executable by said microprocessor for cycling said first and second loads while measuring the output voltage of the battery and using said measurements to estimate the output current of an alternator connected to said battery.

26. A hand-held battery tester as set forth in claim 16 which includes a microprocessor and a terminal for connecting said microprocessor to an off-board computer.

27. A method of testing an alternator that is part of a charging system for a lead-acid battery, said alternator also being connected to an engine, said method comprising
- connecting the battery to a load and measuring the regulation voltage across the battery while said engine is running,
- measuring the AC ripple voltage in the load current drawn from the battery, and
- evaluating the condition of the alternator on the basis of the measured regulation voltage and AC ripple voltage.

28. The method of claim 27 in which the alternator is evaluated as "low regulation" if the measured regulation voltage is less than 13 volts, or "high regulation" if the measured regulation voltage is greater than 15 volts, or "good regulation" if the measured regulation voltage is between 13 and 15 volts, or "bad diode" if the measured AC ripple is greater than 50 millivolts.

29. A method of testing an alternator that is part of a charging system for a lead-acid battery, said alternator also being connected to an engine, said method comprising
- automatically connecting the battery to a load and measuring the voltage across the battery while said engine is running,
- cycling said load on and off during a preselected time interval according to whether the measured voltage is above or below a preselected threshold, and
- estimating the alternator output current from the percentage of time said load is on during said cycling.

30. The method of claim 28 which includes determining whether said load remains on during the entirety of said preselected time interval and, when the answer is affirmative, estimating that the alternator output current is at least a predetermined value.

31. A method of testing a starter powered by a lead-acid battery and connected to an engine to be started, said method comprising
- connecting the battery to a load and measuring the loaded voltage across the terminals of the battery while connected to said load,
- measuring the beginning voltage across the terminals of the battery in the absence of a load,
- starting the engine and measuring the minimum voltage across the terminals of the battery during the starting of the engine, and
- estimating the starter current draw from said loaded voltage, beginning voltage, and minimum voltage.

32. The method of claim 31 which includes
- computing the internal resistance of said battery from said loaded voltage and the current drawn by said load when connected to said battery, and
- estimating said starter current draw by dividing the difference between said beginning and minimum voltages by said internal resistance.

* * * * *